(12) United States Patent
Taga et al.

(10) Patent No.: US 11,217,470 B2
(45) Date of Patent: Jan. 4, 2022

(54) SUBSTRATE PLACING TABLE AND SUBSTRATE PROCESSING APPARATUS

(71) Applicant: Tokyo Electron Limited, Tokyo (JP)

(72) Inventors: Satoshi Taga, Miyagi (JP); Naoyuki Satoh, Miyagi (JP); Tatsuo Nishita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 16/721,086

(22) Filed: Dec. 19, 2019

(65) Prior Publication Data

US 2020/0211885 A1 Jul. 2, 2020

(30) Foreign Application Priority Data

Dec. 27, 2018 (JP) .............................. JP2018-244752
Nov. 8, 2019 (JP) .............................. JP2019-203311

(51) Int. Cl.
*H01L 21/683* (2006.01)
*H01J 37/32* (2006.01)
*C23C 4/134* (2016.01)

(52) U.S. Cl.
CPC .......... *H01L 21/6833* (2013.01); *C23C 4/134* (2016.01); *H01J 37/32697* (2013.01);
(Continued)

(58) Field of Classification Search
CPC . C23C 4/02; C23C 4/134; C23C 28/00; H01J 37/32715; H01J 37/32697;
(Continued)

(56) References Cited

U.S. PATENT DOCUMENTS

| | | | |
|---|---|---|---|
| 2004/0168640 A1* | 9/2004 | Muto | H01L 21/6833 118/728 |
| 2016/0036355 A1* | 2/2016 | Moriya | H02N 13/00 361/234 |
| 2018/0108555 A1* | 4/2018 | Kosakai | H01L 21/6875 |

FOREIGN PATENT DOCUMENTS

| | | | | |
|---|---|---|---|---|
| JP | 07335732 A | * | 12/1995 | |
| JP | 2008-117982 A | | 5/2008 | |
| WO | WO-2011021824 A2 | * | 2/2011 | ......... H01L 21/6833 |

OTHER PUBLICATIONS

Machine translation of Yu et al. International Patent Document WO 2011/021824 A2, Feb. 24, 2011 (Year: 2011).*

(Continued)

*Primary Examiner* — Kevin J Comber
(74) *Attorney, Agent, or Firm* — Studebaker & Brackett PC

(57) ABSTRACT

A substrate placing table according to an exemplary embodiment includes a base and an electrostatic chuck provided on the base. The electrostatic chuck includes a lamination layer portion, an intermediate layer, and a covering layer. The lamination layer portion is provided on the base. The intermediate layer is provided on the lamination layer portion. The covering layer is provided on the intermediate layer. The lamination layer portion includes a first layer, an electrode layer, and a second layer. The first layer is provided on the base. The electrode layer is provided on the first layer. The second layer is provided on the electrode layer. The intermediate layer is provided between the second layer and the covering layer and is in close contact with the second layer and the covering layer. The second layer is a resin layer. The covering layer is ceramics.

10 Claims, 24 Drawing Sheets

(52) U.S. Cl.
CPC ... *H01J 37/32724* (2013.01); *H01J 37/32183* (2013.01); *H01J 2237/002* (2013.01)

(58) Field of Classification Search
CPC ........... H01J 37/32734; H01J 37/32183; H01J 2237/002; H01L 21/67109; H01L 21/6831; H01L 21/6833; H01L 21/68735; H01L 21/68757; H01L 21/68758; H01L 21/6875
USPC ........................................................ 361/234
See application file for complete search history.

(56) References Cited

OTHER PUBLICATIONS

Machine translation of Watanabe Japanese Patent Document JP H07-335732 A, Dec. 22, 1995 (Year: 1995).*

* cited by examiner

SUBSTRATE PLACING TABLE AND SUBSTRATE PROCESSING APPARATUS

CROSS-REFERENCE TO RELATED APPLICATIONS

This application is based on and claims the benefit of priority from Japanese Patent Application Nos. 2018-244752 and 2019-203311 filed on Dec. 27, 2018 and Nov. 8, 2019, respectively, with the Japan Patent Office, the entire contents of which are incorporated herein by reference.

TECHNICAL FIELD

Exemplary embodiments of the present disclosure relate to a substrate placing table and a substrate processing apparatus.

BACKGROUND

A substrate (wafer) placed on a placing table can be held by an electrostatic chuck. The electrostatic chuck electrostatically attracts the wafer to the placing table by an electrostatic force. A placing device disclosed in Japanese Unexamined Patent Publication No. 2008-117982 is provided with a placing body and an electrostatic chuck. An object to be treated is placed on the placing body. The electrostatic chuck is provided with an insulating layer and an electrode layer embedded in the insulating layer. In the electrostatic chuck, voltage is applied to the electrode layer, whereby an electrostatic force is generated between the electrode layer and the object to be treated, and thus the object to be treated is electrostatically attracted to the surface of the insulating layer. An electrostatic chuck layer which is an insulating layer on the surface side of the electrode layer is an yttrium oxide sprayed layer having a thickness in a range of 200 to 280 µm and formed by plasma spraying. The surface of the electrostatic chuck layer is formed with a surface roughness depending on the particle size of yttrium oxide which is thermally sprayed.

SUMMARY

In an exemplary embodiment, a substrate placing table is provided. The substrate placing table includes a base and an electrostatic chuck provided on the base. The electrostatic chuck includes a lamination layer portion, an intermediate layer, and a covering layer. The lamination layer portion is provided on the base. The intermediate layer is provided on the lamination layer portion. The covering layer is provided on the intermediate layer. The lamination layer portion includes a first layer, an electrode layer, and a second layer. The first layer is provided on the base. The electrode layer is provided on the first layer. The second layer is provided on the electrode layer. The intermediate layer is provided between the second layer and the covering layer and is in close contact with the second layer and the covering layer. The second layer is a resin layer. The covering layer is ceramics.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
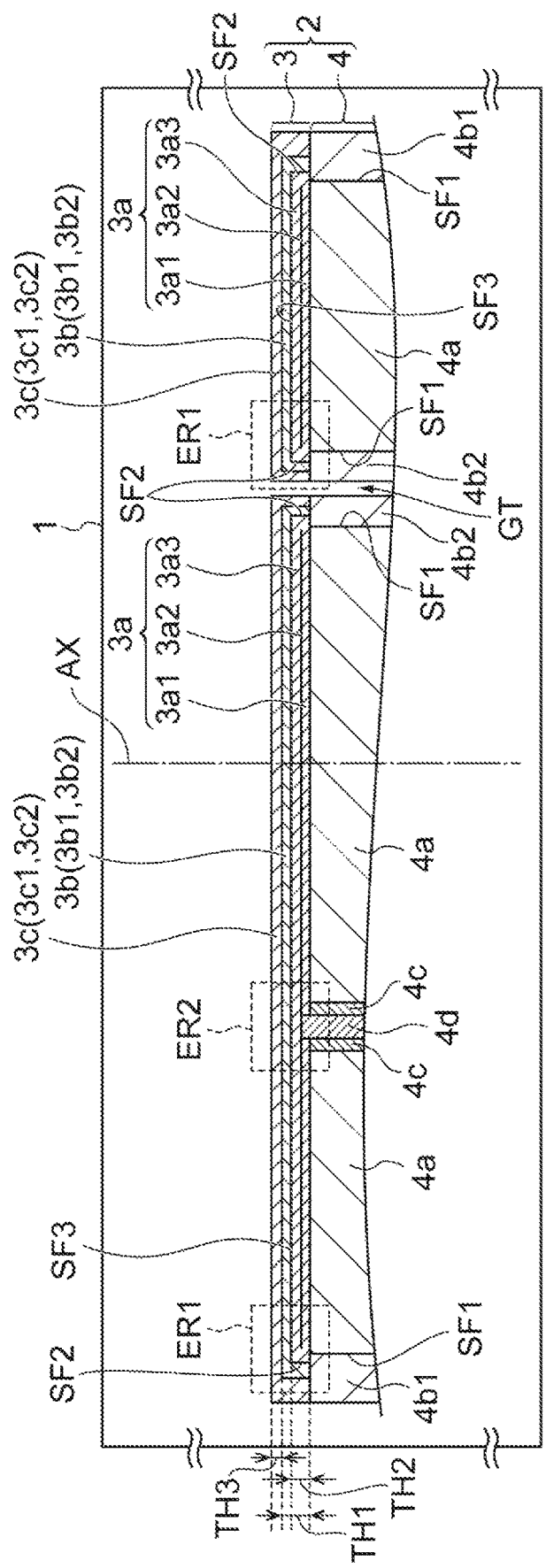
FIG. 1 is a diagram showing an example of a configuration of a substrate placing table according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The present disclosure provides a technique for suppressing an electric discharge between a substrate placing table and a substrate.

Hereinafter, various exemplary embodiments will be described. In an exemplary embodiment, a substrate placing table is provided. The substrate placing table includes a base and an electrostatic chuck provided on the base. The electrostatic chuck includes a lamination layer portion, an intermediate layer, and a covering layer. The lamination layer portion is provided on the base. The intermediate layer is provided on the lamination layer portion. The covering layer is provided on the intermediate layer. The lamination layer portion includes a first layer, an electrode layer, and a second layer. The first layer is provided on the base. The electrode layer is provided on the first layer. The second layer is provided on the electrode layer. The intermediate layer is provided between the second layer and the covering layer and is in close contact with the second layer and the covering layer. The second layer is a resin layer. The covering layer is ceramics. Since it is known that the second layer provided on the electrode layer of the electrostatic chuck in this manner has a relatively high insulation resistance as resin, it is possible to sufficiently reduce the thickness of the second layer while maintaining a predetermined insulation resistance. Therefore, the combined electrostatic capacity of the electrostatic chuck can be increased, and thus the potential between the substrate placed on the substrate placing table and the base can be reduced. For this reason, when voltage is applied to the substrate placing table at a relatively low frequency, a voltage phase difference is reduced, whereby the generation of an electric discharge between the substrate placing table and the substrate can be suppressed.

In the exemplary embodiment, the first layer is a resin layer.

In the exemplary embodiment, the base includes a main body part and a side wall part provided on a side surface of the base. The electrostatic chuck is disposed on the main body part and the side wall part. A diameter of each of the first layer and the second layer is larger than a diameter of the main body part. The first layer and the second layer extend on the base to overlap the side wall part.

In the exemplary embodiment, the intermediate layer includes an end portion region that covers a side surface of the lamination layer portion. The end portion region is in contact with the base and has a tapered shape that is tapered in a direction separated from the lamination layer portion.

In the exemplary embodiment, a taper angle of the end portion region is 45° or less.

In the exemplary embodiment, a material of the first layer and a material of the second layer are any one of polyimide resin, silicone resin, epoxy resin, and acrylic resin.

In the exemplary embodiment, the substrate placing table further includes an end portion region. The end portion region covers a side surface of the lamination layer portion. A material of the end portion region is resin or an insulator. The first layer is an insulating layer or a resin layer.

In the exemplary embodiment, a material of the first layer in a case where the first layer is an insulating layer is ceramic. A material of the first layer in a case where the first layer is a resin layer is any one of polyimide resin, silicone resin, epoxy resin, and acrylic resin. A material of the second layer is any one of polyimide resin, silicone resin, epoxy resin, and acrylic resin.

In the exemplary embodiment, the end portion region made of resin has a tapered shape that is tapered in a direction separated from the lamination layer portion.

In the exemplary embodiment, the base has an insulating region on a surface of the base. The insulating region has a portion extending along a side surface of the lamination layer portion. The end portion region made of resin is provided between the side surface of the lamination layer portion and the portion of the insulating region.

In the exemplary embodiment, the base includes a main body part and a side wall part provided on a side surface of the base. The electrostatic chuck is disposed on the main body part and the side wall part. An inner diameter of each of the first layer and the second layer is smaller than an inner diameter of the main body part. The first layer and the second layer extend on the base to overlap the side wall part. A surface of the side wall part has a portion extending along a side surface of the lamination layer portion. The end portion region made of resin is provided between the side surface of the lamination layer portion and the portion of the surface of the side wall part.

In the exemplary embodiment, a diameter of the electrode layer is smaller than a diameter of each of the first layer and the second layer.

In the exemplary embodiment, the intermediate layer covers an entire surface of the lamination layer portion provided on the base.

In the exemplary embodiment, the intermediate layer covers a part of the side wall part.

In the exemplary embodiment, the covering layer includes a foundation layer and a plurality of protrusion portions. The foundation layer is in close contact with the intermediate layer. The plurality of protrusion portions are provided on an upper surface of the foundation layer.

In the exemplary embodiment, a surface roughness of the upper surface of the foundation layer is in a range of 0.05 to 0.5 pnm.

In the exemplary embodiment, the intermediate layer includes a base body and a plurality of granules dispersed in the base body. The plurality of granules include exposed portions exposed from the base body, and the exposed portions are in contact with the second layer and the covering layer.

In the exemplary embodiment, a material of the base body contains resin or a silane-based agent, and a material of the granule is ceramic. The silane-based agent is, for example, an inorganic material containing silicon atoms and oxygen atoms.

In an exemplary embodiment, a substrate processing apparatus is provided. The substrate processing apparatus includes any one of the substrate placing tables described above.

The substrate processing apparatus according to the exemplary embodiment includes a radio frequency power source, and the radio frequency power source is connected to the substrate placing table and supplies radio frequency power of 3 MHz or less to the substrate placing table.

Hereinafter, various exemplary embodiments will be described in detail with reference to the drawings. In each drawing, identical or equivalent parts are denoted by the same reference numerals. First, an embodiment of the configuration of a substrate placing table 2 will be described with reference to FIG. 1.

The substrate placing table 2 is provided in a substrate processing apparatus 1. The substrate processing apparatus 1 can be, for example, a parallel plate type plasma processing apparatus, but is not limited thereto. The substrate processing apparatus 1 is sufficiently provided with devices necessary for plasma processing on a substrate (hereinafter, there is a case where it is referred to as a wafer) placed on the substrate placing table 2. However, details of the configuration of the substrate processing apparatus 1 are not shown in FIG. 1. The details of the configuration of the substrate processing apparatus 1 will be described later with reference to FIG. 7.

The substrate placing table 2 has a substantially disk shape extending to intersect a central axis AX. The substrate placing table 2 includes an electrostatic chuck 3 and a base 4. The electrostatic chuck 3 is provided on the base 4. The electrostatic chuck 3 includes a lamination layer portion 3a, an intermediate layer 3b, and a covering layer 3c. The lamination layer portion 3a is provided on the base 4. The intermediate layer 3b is provided on the lamination layer portion 3a. The covering layer 3c is provided on the intermediate layer 3b.

The lamination layer portion 3a includes a layer 3a1 (a first layer), an electrode layer 3a2, and a layer 3a3 (a second layer). The layer 3a1 is provided on the base 4. The electrode layer 3a2 is provided on the layer 3a1. The layer 3a3 is provided on the electrode layer 3a2. The layer 3a3 is a resin layer.

Figure 2:
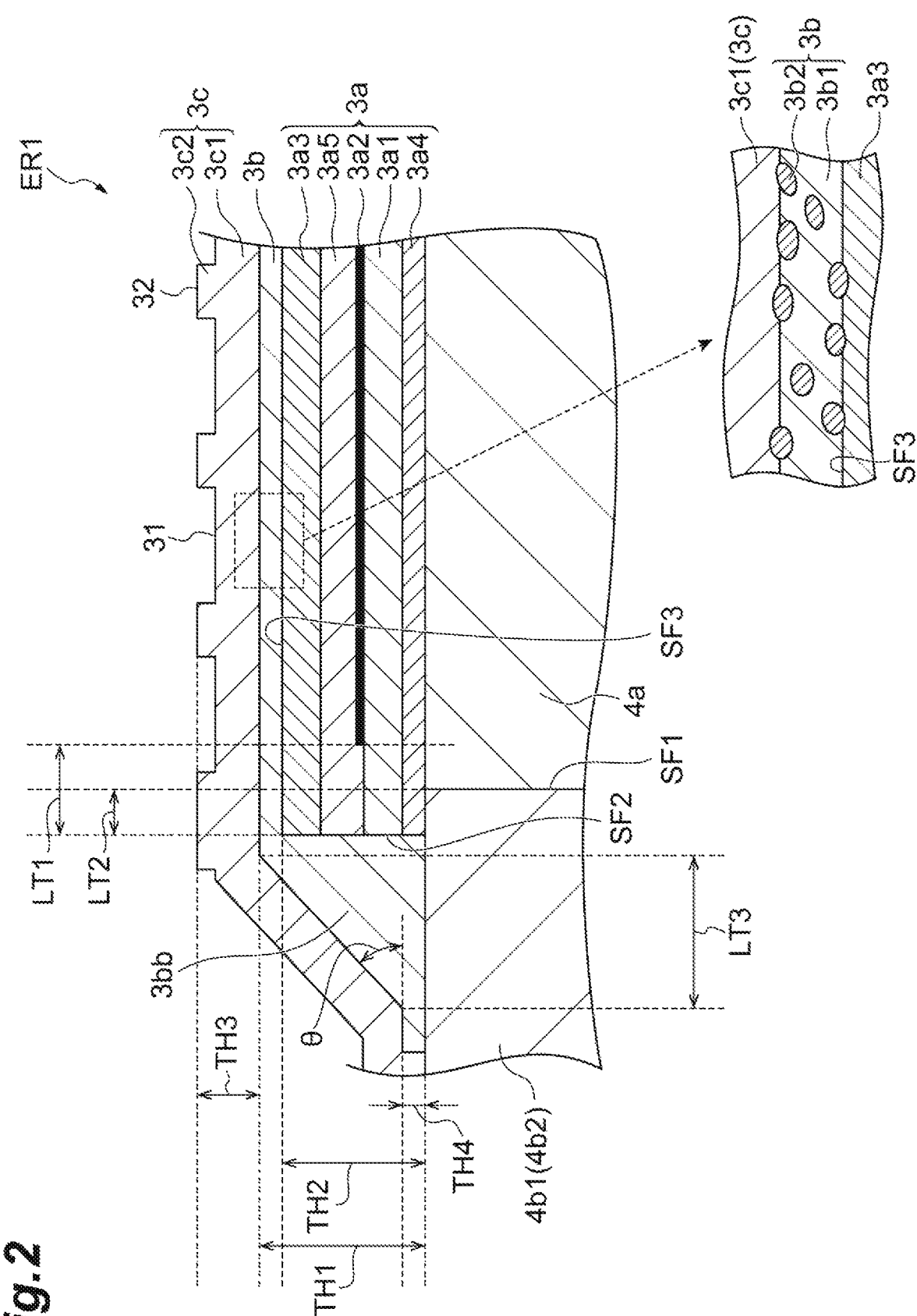
FIG. 2 is a diagram showing an example of a configuration of an end portion of the substrate placing table shown in FIG. 1.

Here, as shown in FIG. 2, the intermediate layer 3b includes a base body 3b1 and a plurality of granules 3b2, and the plurality of granules 3b2 are dispersed in the base body 3b1. Some of the plurality of granules 3b2 are exposed from the base body 3b1 to the sides of the layer 3a3 and the covering layer 3c (more specifically, a foundation layer 3c1), which are in contact with the base body 3b1. The plurality of granules 3b2 include exposed portions exposed from the base body 3b1 in this manner. The exposed portions are in contact with the layer 3a3 and the covering layer 3c. For this reason, the intermediate layer 3b and the layer 3a3, and the intermediate layer 3b and the covering layer 3c (more specifically, the foundation layer 3c1) are brought into close contact with each other with a strong bonding force, and therefore, the degree of adhesion is improved. The covering layer 3c includes the foundation layer 3c1 and a plurality of protrusion portions 3c2. The plurality of protrusion portions 3c2 are provided on an upper surface 31 of the foundation layer 3c1. In a case where the substrate is placed on the substrate placing table 2, the substrate is in contact with the plurality of protrusion portions 3c2.

Description will be made returning to FIG. 1. The intermediate layer 3b covers the entire surface (including a side surface SF2 of the lamination layer portion 3a and an upper surface SF3 of the lamination layer portion 3a) of the lamination layer portion 3a provided on the base 4. The covering layer 3c covers the entire surface of the intermediate layer 3b provided on the base 4.

The intermediate layer 3b is provided between the layer 3a3 and the covering layer 3c (in particular, the foundation layer 3c1). The intermediate layer 3b is in close contact with the layer 3a3 and the foundation layer 3c1. The base body 3b1 and the granules 3b2 are in contact with the foundation layer 3c1 and also are in contact with the layer 3a3.

A thickness TH1 corresponds to the sum of the thickness of the lamination layer portion 3a and the thickness of the intermediate layer 3b. A thickness TH2 corresponds to the thickness of the lamination layer portion 3a. A thickness TH3 corresponds to the thickness of the covering layer 3c.

The base 4 includes a main body part 4a, a side wall part 4b1, and a side wall part 4b2. The side wall part 4b1 and the side wall part 4b2 are provided on side surfaces SF1 of the main body part 4a. The electrostatic chuck 3 is disposed on the main body part 4a, the side wall part 4b1, and the side wall part 4b2.

The side wall part 4b1 corresponds to the outer wall of the base 4. The side wall part 4b2 corresponds to a sleeve that defines a hole GT penetrating the electrostatic chuck 3 and the base 4 in the base 4. The hole GT can be a hole through which a gas flows, or a hole provided in order to move a pin up and down when placing a wafer W on the substrate placing table 2.

Figure 3:
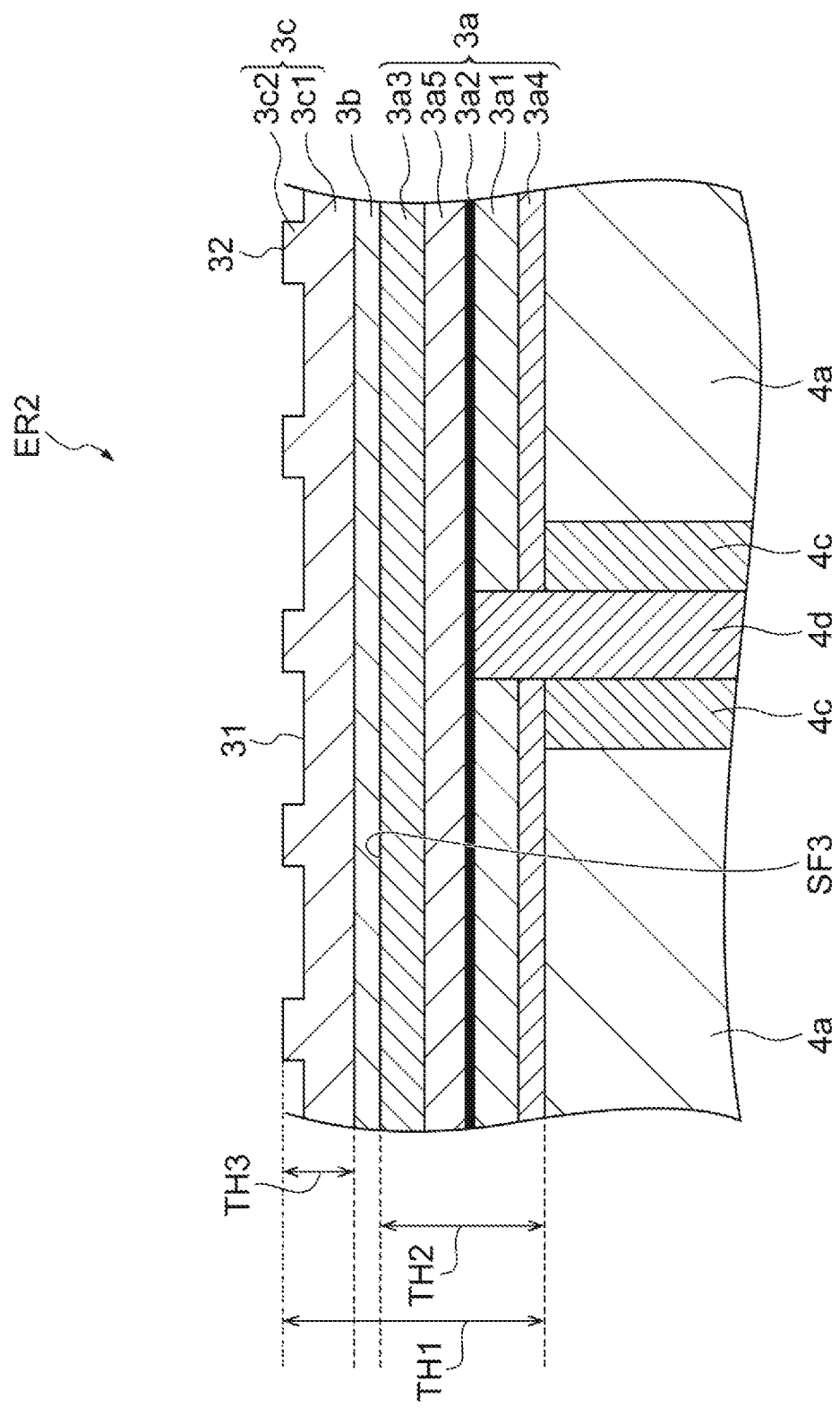
FIG. 3 is a diagram showing an example of a configuration of a part of the substrate placing table shown in FIG. 1.

Further, as shown in FIG. 3 as well, the base 4 is provided with a contact pin 4d. The contact pin 4d is electrically connected to the electrode layer 3a2. In the base 4, the contact pin 4d is covered with a sleeve 4c. The configuration shown in FIG. 3 is a configuration which is included in a region ER2 shown in FIG. 1.

The configuration of an end portion of the substrate placing table 2 will be described with reference to FIG. 2. The end portion of the substrate placing table 2 shown in FIG. 2 has a configuration which is included in a region ER1 shown in FIG. 1. The end portion of the substrate placing table 2 is a portion which includes the side wall part 4b1 corresponding to the outer wall portion of the base 4, and is a portion which includes the side wall part 4b2 corresponding to the sleeve defining the hole GT.

In the end portion of the substrate placing table 2, the intermediate layer 3b includes an end portion region 3bb. The end portion region 3bb covers the side surface SF2 of the lamination layer portion 3a. The end portion region 3bb is in contact with the base 4, and more specifically is in contact with the side wall part 4b1 and the side wall part 4b2.

The end portion region 3bb has a tapered shape that is tapered in a direction separated from the lamination layer portion 3a. In other words, the end portion region 3bb has a thickness that decreases in the direction separated from the lamination layer portion 3a. The thickness of the end portion region 3bb decreases substantially linearly in the direction separated from the lamination layer portion 3a and converges to a thickness TH4.

More specifically, the thickness of the end portion region 3bb converges to the thickness TH4 at a location separated from the lamination layer portion 3a approximately by a length LT3. The length LT3 corresponds to the width of a joined portion between the end portion region 3bb and each of the side wall part 4b1 and the side wall part 4b2.

The tapered shape of the end portion region 3bb is not limited to the shape that is tapered substantially linearly, as shown in FIG. 2. For example, the tapered shape of the end portion region 3bb can be either of a shape tapered with a concave shape (with negative curvature) as in the end portion region 3bb shown in FIG. 4, or a shape tapered with a convex shape (with positive curvature) as in the end portion region 3bb shown in FIG. 5.

The diameter of the electrode layer 3a2 is smaller than the diameter of each of the layer 3a1 and the layer 3a3. A length LT1 corresponds to ½ of the difference between the diameter of each of the layer 3a1 and the layers 3a3 and the diameter of the electrode layer 3a2.

The diameter of each of the layer 3a1 and the layer 3a3 is larger than the diameter of the main body part 4a. A length LT2 corresponds to ½ of the difference between the diameter of each of the layer 3a1 and the layer 3a3 and the diameter of the main body part 4a. In this manner, the layer 3a1 and the layer 3a3 extend on the base 4 to overlap the side wall part 4b1 and the side wall part 4b2. The intermediate layer 3b covers a part of the side wall part 4b1 and a part of the side wall part 4b2.

According to the substrate placing table 2 having the configuration described above, since the layers 3a1 and 3a3 sandwiching the electrode layer 3a2 of the electrostatic chuck 3 have high insulation resistance, it is possible to sufficiently reduce the thicknesses of the layers 3a1 and 3a3 while maintaining predetermined insulation resistance. Therefore, the combined electrostatic capacity of the electrostatic chuck 3 can be increased, and thus the potential between the substrate placed on the substrate placing table 2 and the base 4 can be reduced. For this reason, when voltage is applied to the substrate placing table 2 at a relatively low frequency, for example, a frequency of 3 MHz or less, a voltage phase difference is reduced, whereby generation of an electric discharge between the substrate placing table and the substrate can be suppressed.

The electrostatic capacity (combined electrostatic capacity) of the electrostatic chuck 3 is made to be in a range of about 10 to 21 pF/cm$^2$. In a case where the electrostatic capacity is smaller than 10 pF/cm$^2$, if a radio frequency power of 3 MHz or less is applied to the substrate placing table, an electric discharge between the substrate placing table and the substrate is easily generated. Further, the upper limit value of the electrostatic capacity that is currently possible is 21 pF/cm$^2$.

The thickness of the electrode layer 3a2 is about 5 µm. The thickness of the layer 3a1 is in a range of about 25 to 50 µm. The relative dielectric constant of the layer 3a1 is about 3.2. The thickness of the layer 3a3 is in a range of about 25 to 50 µm. The relative dielectric constant of the layer 3a3 is about 3.2.

The thickness of an adhesion layer 3a4 is in a range of about 10 to 20 µm. The relative dielectric constant of the adhesion layer 3a4 is about 3.0. The thickness of an adhesion layer 3a5 is in a range of about 10 to 20 µm. The relative dielectric constant of the adhesion layer 3a5 is about 3.0.

The thickness of the intermediate layer 3b is in a range of about 20 to 100 µm. The relative dielectric constant of the intermediate layer 3b is about 2.7. The thickness (the thickness TH3 shown in FIGS. 1 to 5) of the covering layer 3c is about 65 µm.

The thickness of the foundation layer 3c1 is about 50 µm. The relative dielectric constant of the foundation layer 3c1 is about 7.1. The thickness of the protrusion portion 3c2 is about 15 µm. The relative dielectric constant of the protrusion portion 3c2 is about 7.1.

The surface roughness (arithmetic mean roughness: Ra) of the upper surface 31 of the foundation layer 3c1 is in a range of 0.05 to 0.5 µm. The surface roughness (arithmetic mean roughness: Ra) of an end surface 32 of the protrusion portion 3c2 is in a range of 0.05 to 0.5 µm.

The plurality of protrusion portions 3c2 are provided such that, for example, about 20% of the substrate is in contact therewith.

Figure 4:
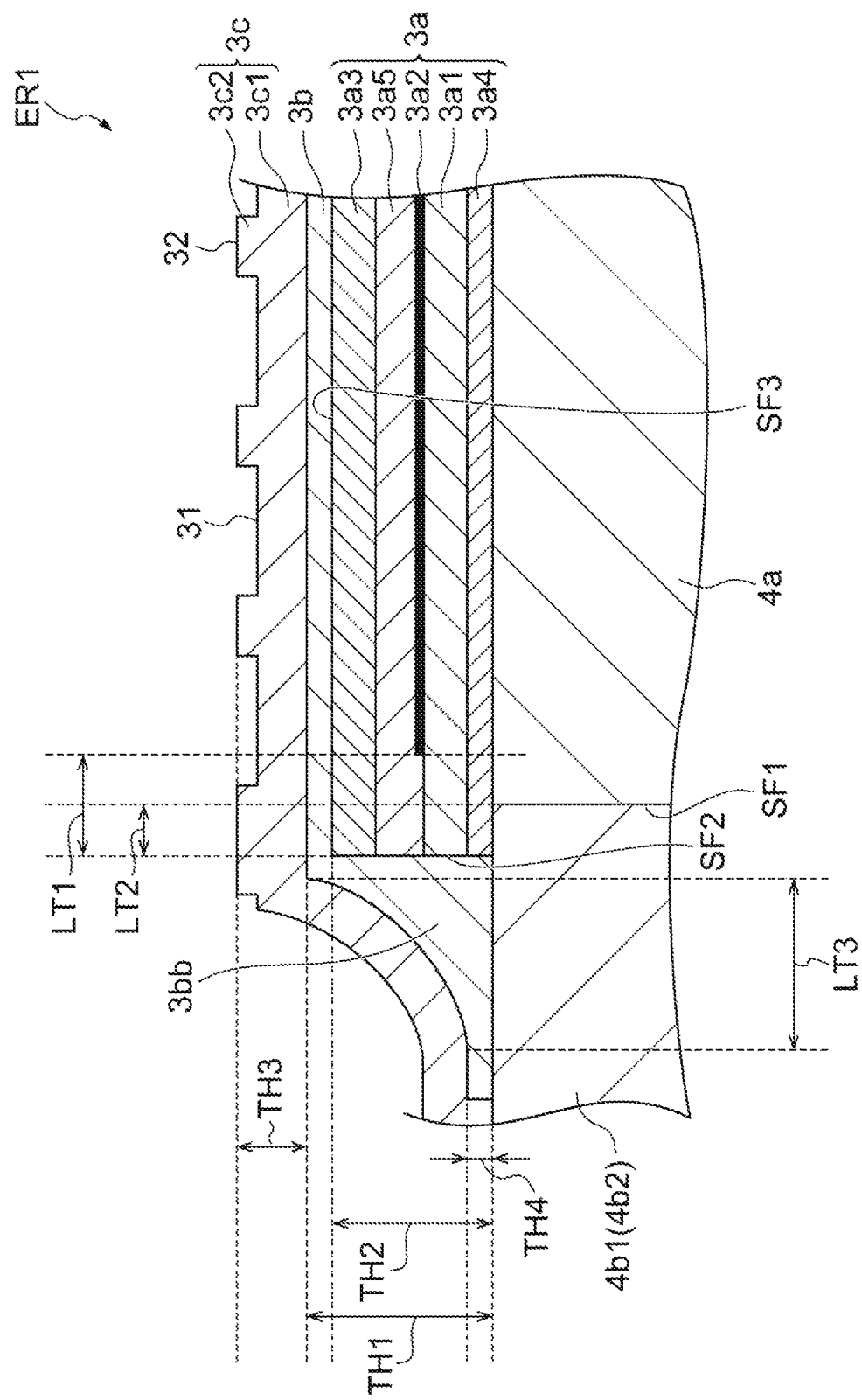
FIG. 4 is a diagram showing another example of the configuration of the end portion of the substrate placing table shown in FIG. 1.
Figure 5:
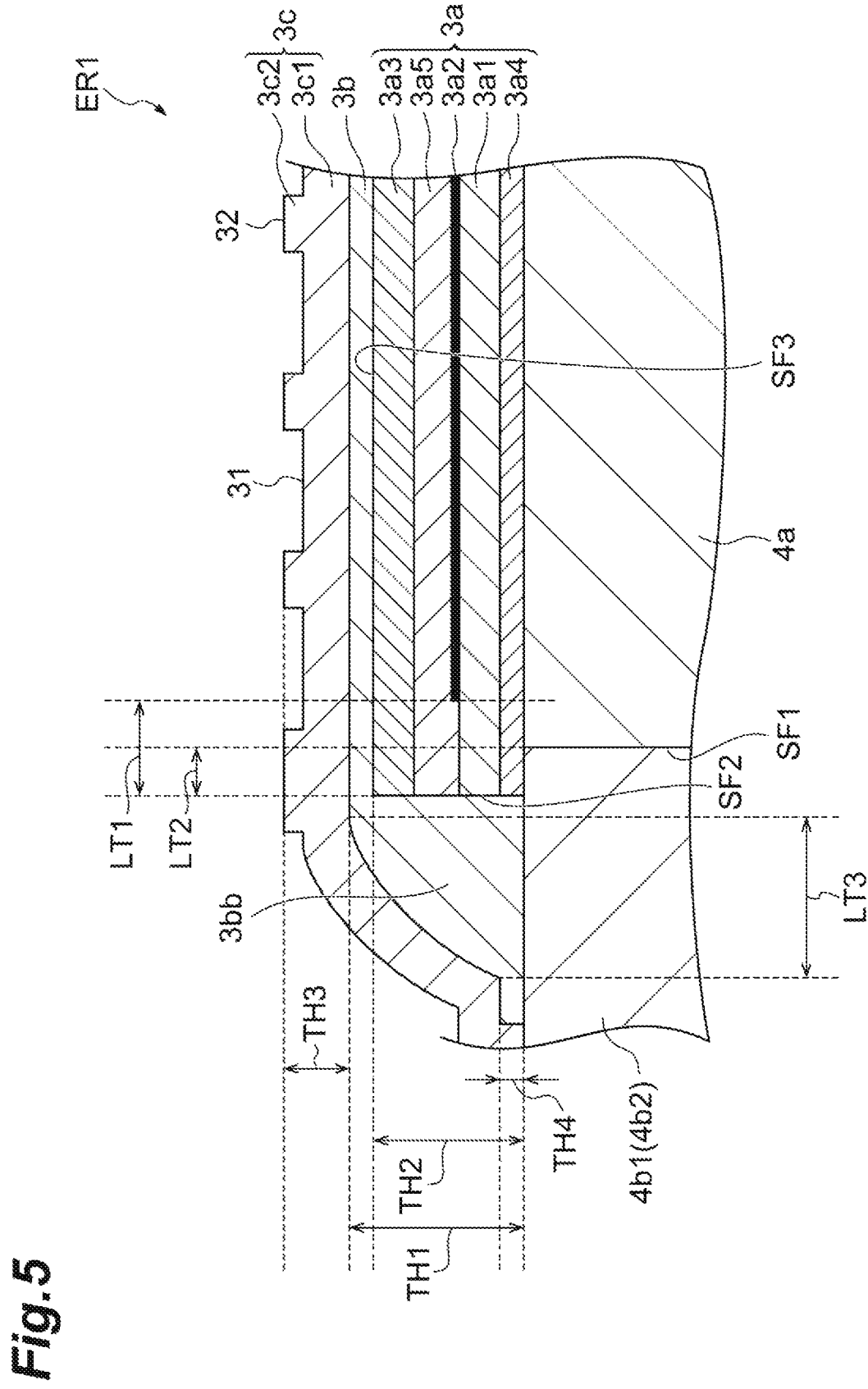
FIG. 5 is a diagram showing another example of the configuration of the end portion of the substrate placing table shown in FIG. 1.

The length LT1 shown in FIGS. 2, 4, and 5 is in a range of about 1.2 to 2.2 mm. The length LT2 shown in FIGS. 2, 4, and 5 is in a range of about 0.7 to 1 mm. In a case where the length LT2 is shorter than 0.7 mm, a leakage current increases at the interface between the ceramics and the layer 3a1, and thus an electric discharge easily occurs between the substrate placing table 2 and the substrate. On the other hand, the area of the lamination layer portion 3a which is in contact with the base 4 is maximized in order to obtain an adsorption force. For this reason, in a case where the length LT2 is longer than 1 mm, the diameter of the main body part 4a is reduced and the diameter of the ceramics is increased. Therefore, the heat removal area of the base 4 is reduced, so that the temperature of the substrate is locally increased and the temperature in-plane uniformity of the substrate is reduced.

A taper angle θ of the end portion region 3bb shown in FIG. 2 is, for example, 45° or less.

The layer 3a1 shown in each of FIGS. 2 to 6 is, for example, a resin layer. In this case, the material of the layer 3a1 and the material of the layer 3a3 can be, for example, polyimide resin, silicone resin, epoxy resin, or acrylic resin. The materials of the layer 3a1 and the layer 3a3 may be different from each other. The covering layer 3c is ceramics. The material of the side wall part 4b1 and the material of the side wall part 4b2 are ceramic.

The material of the base body 3b1 of the intermediate layer 3b contains resin or a silane-based agent. The material of the granule 3b2 is ceramic.

An example of a method of forming the covering layer 3c will be described with reference to FIG. 6. The method of forming the covering layer 3c is not limited to the method shown in FIG. 6 as long as the formation of the protrusion portions 3c2 of the covering layer 3c can be suitably realized.

Figure 6:
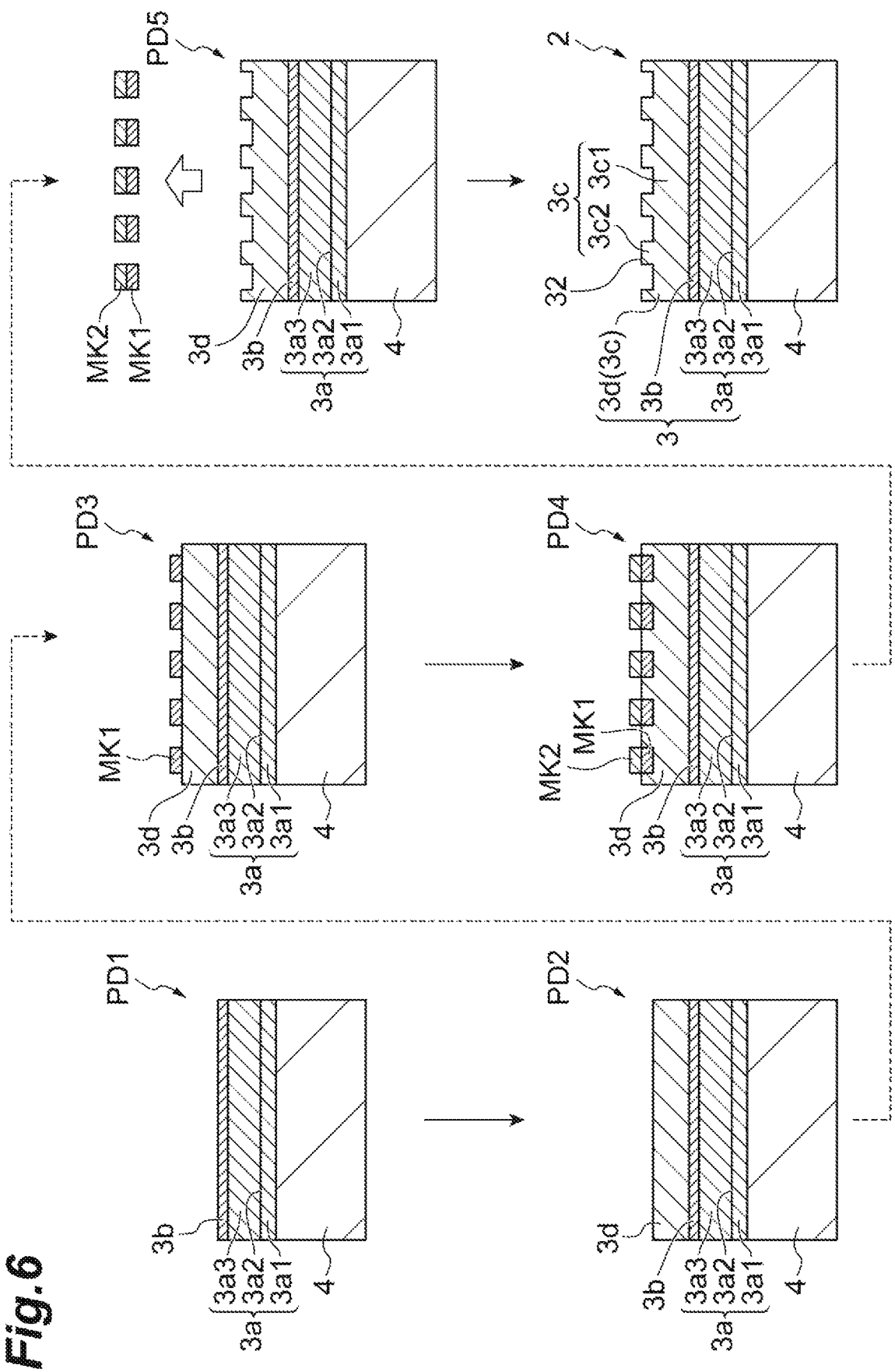
FIG. 6 is a diagram for explaining a method of forming a covering layer shown in each of FIGS. 2 to 5.

For the execution of the method shown in FIG. 6, a plasma spraying apparatus for forming the covering layer 3c made of ceramics by thermal spraying is used. First, a product PD1 is installed in the plasma spraying apparatus. The product PD1 includes the base 4, the lamination layer portion 3a, and the intermediate layer 3b. The lamination layer portion 3a is provided on the base 4, and the intermediate layer 3b is provided on the lamination layer portion 3a. The lamination layer portion 3a includes the layer 3a1, the electrode layer 3a2, and the layer 3a3.

Subsequently, ceramic spraying is performed on the intermediate layer 3b of the product PD1, so that a product PD2 is formed. In the ceramic spraying, for example, powder of a thermal spray material having a particle diameter of 15 µm or less is sprayed from a tip portion of a nozzle to a plasma generating portion having the axis common with the nozzle together with a plasma generating gas. Subsequently, plasma is generated from the plasma generation gas with an electric power of 50 kW or less in the plasma generation portion, and the sprayed powder of the thermal spray material is liquefied by the plasma and sprayed so as to cover the surface of the intermediate layer 3b. Since the particle diameter of the powder of the thermal spray material is small and the amount of electric power for melting the powder of the thermal spray material can be reduced, a covering layer 3d can be formed without burnout of the intermediate layer 3b during thermal spraying. In the product PD2, the covering layer 3d is formed on the intermediate layer 3b by ceramic spraying. The covering layer 3c shown in FIGS. 1 to 5 is formed by processing the covering layer 3d.

In the product PD2, the surface of the covering layer 3d is further polished. Due to this polishing, the surface roughness of the surface of the covering layer 3d becomes approximately the same as the surface roughness of the upper surface 31 of the foundation layer 3*cl* shown in FIGS. 1 to 5.

Subsequently, a product PD3 is formed by disposing, for example, a resin mask MK1 having a plurality of opening portions on the covering layer 3*d* of the product PD2. The opening portion of the mask MK1 corresponds to a location where the protrusion portion 3*c*2 is provided in the covering layer 3*c* shown in FIGS. 1 to 5.

Subsequently, ceramic spraying is further performed on the product PD3 from above the mask MK1 and the covering layer 3*d*, so that a product PD4 is formed. The material of ceramics which is used for the formation of the product PD4 is the same as the material of ceramics used for the formation of the covering layer 3*d*. In the product PD4, the plurality of opening portions of the mask MK1 are filled with ceramics and a mask MK2 made of ceramic is also formed on the mask MK1. In the product PD4, the locations where the plurality of opening portions of the mask MK1 are filled with ceramic correspond to the protrusion portions 3*c*2 shown in FIGS. 1 to 5.

Subsequently, the mask MK1 and the mask MK2 are removed from the product PD4, so that a product PD5 is formed. In the product PD5, concavities and convexities (the protrusion portion corresponds to the protrusion portion 3*c*2 shown in FIGS. 1 to 5) formed by removing the mask MK1 and the mask MK2 are provided on the surface of the covering layer 3*d*.

Subsequently, the end surfaces of the protrusion portions of the covering layer 3*d* of the product PD5 are polished, so that the covering layer 3*c* is formed from the covering layer 3*d*, and the substrate placing table 2 is formed. Due to this polishing, the surface roughness of the end surface of the protrusion portion of the covering layer 3*d* of the product PD5 becomes approximately the same as the surface roughness of the end surface 32 of the protrusion portion 3*c*2 shown in FIGS. 1 to 5.

The foundation layer 3*c*1 and the protrusion portions 3*c*2 are formed as described above, whereby not only the surface roughness of the end surface 32 of the protrusion portion 3*c*2 but also the surface roughness of the upper surface 31 of the foundation layer 3*c*1 is reduced. For this reason, for example, when plasma cleaning is performed without placing a substrate, the surface is not easily crushed by the plasma, and therefore, particles which are generated from the foundation layer are sufficiently reduced. The protrusion portion 3*c*2 is not limited to the formation method using a mask, and for example, the protrusion portion 3*c*2 may be formed without using a mask after the surface of the covering layer 3*d* of the product PD2 is polished.

Figure 7:
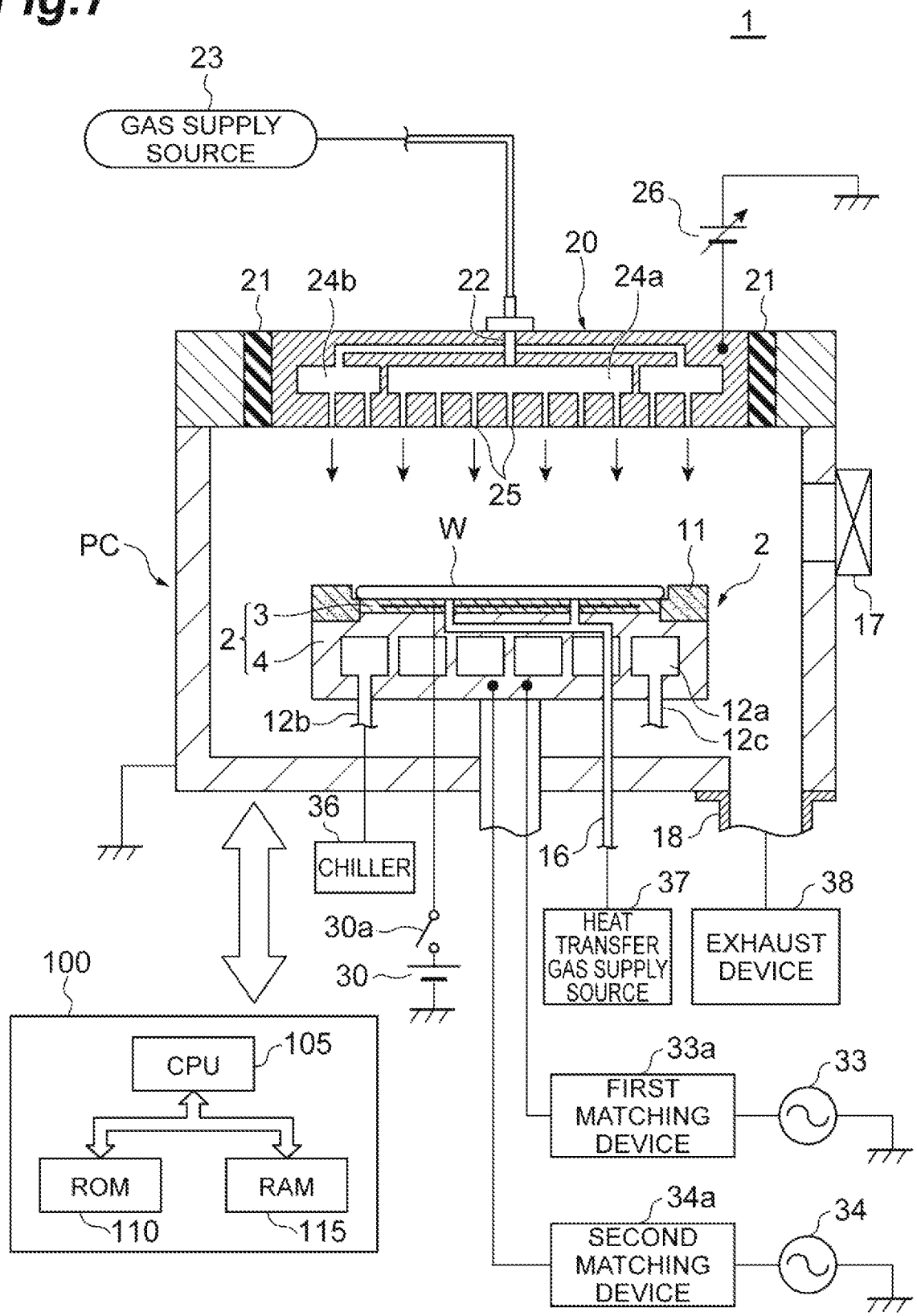
FIG. 7 is a diagram showing an example of a configuration of a substrate processing apparatus provided with the substrate placing table shown in FIG. 1.

An example of the substrate processing apparatus according to an exemplary embodiment will be described with reference to FIG. 7. The substrate processing apparatus 1 is a parallel plate type capacitively coupled plasma processing apparatus and has a substantially cylindrical processing container PC (chamber). An yttrium oxide film is thermally sprayed on the inner surface of the processing container PC, or alumite treatment (anodization) is performed on the inner surface of the processing container PC. The interior of the processing container PC serves as a processing chamber in which plasma processing such as etching processing or film formation processing is performed by plasma. The substrate processing apparatus 1 is provided with the substrate placing table 2 shown in FIGS. 1 to 5.

A semiconductor wafer (hereinafter referred to as a "wafer W") which is an example of the substrate is placed on the substrate placing table 2. The substrate placing table 2 also functions as a lower electrode.

A direct-current power source 30 is electrically connected to the electrode layer 3*a*2 through the contact pin 4*d* (refer to FIGS. 1 and 3). If a direct-current voltage is applied from the direct-current power source 30 to the electrode layer 3*a*2 by the opening and closing of a switch 30*a*, the wafer W is attracted to the electrostatic chuck 3 by an electrostatic force.

A focus ring 11 having an annular shape is placed on the outer periphery side of the electrostatic chuck 3 so as to surround an outer edge portion of the wafer W. The material of the focus ring 11 can be, for example, silicon. The focus ring 11 functions to improve the plasma processing efficiency by converging the plasma toward the surface of the wafer W in the processing container PC.

A refrigerant flow path 12*a* is formed in the interior of the base 4. A cooling medium (hereinafter also referred to as a "refrigerant") such as cooling water or brine, for example, output from a chiller 36 flows and circulates through a refrigerant inlet pipe 12*b*, the refrigerant flow path 12*a*, and a refrigerant outlet pipe 12*c*. The substrate placing table 2 made of metal is heat-removed and cooled by the refrigerant circulating in this way.

A heat transfer gas supply source 37 supplies heat transfer gas such as He gas between the front surface of the electrostatic chuck 3 and the back surface of the wafer W through a heat transfer gas supply line 16. With such a configuration, the temperature of the electrostatic chuck 3 is controlled by the refrigerant circulating through the refrigerant flow path 12*a* and the heat transfer gas which is supplied to the back surface of the wafer W. In this way, the wafer W is controlled to a predetermined temperature.

A first radio frequency power source 33 that supplies radio frequency power HF for plasma generation having a first frequency is connected to the substrate placing table 2 through a first matching device 33*a*. Further, a second radio frequency power source 34 that supplies radio frequency power LF for bias voltage generation having a second frequency is connected to the substrate placing table 2 through a second matching device 34*a*. The first frequency is, for example, a radio frequency of 40 MHz, and the first radio frequency power source 33 can supply the radio frequency power HF having the first frequency to the substrate placing table 2. The second frequency is a radio frequency of 3 MHz or less. In the present embodiment, the radio frequency power HF is applied to the substrate placing table 2. However, the radio frequency power HF may be applied to a gas shower head 20.

The first matching device 33*a* functions such that the internal impedance of the first radio frequency power source 33 and load impedance apparently coincide with each other when plasma is generated in the processing container PC. The second matching device 34*a* functions such that the internal impedance of the second radio frequency power source 34 and load impedance apparently coincide with each other when plasma is generated in the processing container PC.

The gas shower head 20 is mounted so as to close an opening of a ceiling portion of the processing container PC through a shield ring 21 that covers an outer edge portion of the gas shower head 20. A variable direct-current power source 26 is connected to the gas shower head 20, and a negative direct-current voltage (DC) is output from the variable direct-current power source 26. The gas shower head 20 may be made of silicon. The gas shower head 20 also functions as a counter electrode (an upper electrode) facing the substrate placing table 2 (the lower electrode).

A gas introduction port 22 for introducing gas is formed in the gas shower head 20. A gas diffusion chamber 24a on the center side and a gas diffusion chamber 24b on the edge side, which are branched from the gas introduction port 22, are provided in the interior of the gas shower head 20. The gas output from a gas supply source 23 is supplied to the gas diffusion chamber 24a and the gas diffusion chamber 24b through the gas introduction port 22, and is diffused in the gas diffusion chamber 24a and the gas diffusion chamber 24b and then introduced toward the substrate placing table 2 through a plurality of gas supply holes 25.

An exhaust port 18 is formed in the bottom surface of the processing container PC, and the inside of the processing container PC is exhausted by an exhaust device 38 connected to the exhaust port 18. In this way, the inside of the processing container PC is maintained at a predetermined degree of vacuum. A gate valve 17 is provided on the side wall of the processing container PC. The gate valve 17 is opened and closed when the wafer W is loaded into the processing container PC or unloaded from the processing container PC.

The substrate processing apparatus 1 is provided with a control device 100 that controls the operation of the entire apparatus. The control device 100 includes a CPU 105 (Central Processing Unit), a ROM 110 (Read Only Memory), and a RAM 115 (Random Access Memory). The CPU 105 executes desired plasma processing such as etching according to a recipe stored in a storage area such as the RAM 115. A process time, pressure (gas exhaust), radio frequency power and voltage, various gas flow rates, a temperature in the processing container PC (a temperature of the upper electrode, a side wall temperature of the processing container PC, a temperature of the wafer W, a temperature of the electrostatic chuck 3, or the like), a temperature of the refrigerant from the chiller 36, and the like are set in the recipe.

When plasma processing such as etching or film formation is executed, the opening and closing of the gate valve 17 is controlled, and the wafer W is loaded into the processing container PC and placed on the substrate placing table 2. If a positive or negative direct-current voltage is applied from the direct-current power source 30 to the electrode layer 3a2, the wafer W is electrostatically attracted to and held on the electrostatic chuck 3.

At the time of the process, a desired gas is supplied from the gas supply source 23 into the processing container PC, and the radio frequency power HF is applied from the first radio frequency power source 33 to the substrate placing table 2. The radio frequency power LF may be applied from the second radio frequency power source 34 to the substrate placing table 2. A negative direct-current voltage may be applied from the variable direct-current power source 26 to the gas shower head 20. In this way, the gas is separated above the wafer W, so that plasma is generated, and the wafer W is subjected to plasma processing by the action of the plasma.

After the plasma processing, a direct-current voltage having a polarity opposite to that at the time of the electrostatic attraction is applied from the direct-current power source 30 to the electrode layer 3a2, and thus the electric charges on the wafer W are discharged. After the discharge of the electric charges, the wafer W is peeled off from the electrostatic chuck 3 and unloaded to the outside of the processing container PC through the gate valve 17.

MODIFICATION EXAMPLES

Each of FIGS. 8 to 24 shows a modification example of the substrate placing table 2. As the materials of the respective configurations according to the modification examples shown in FIGS. 8 to 24, the materials described above can be adopted unless otherwise specified below.

Figure 8:
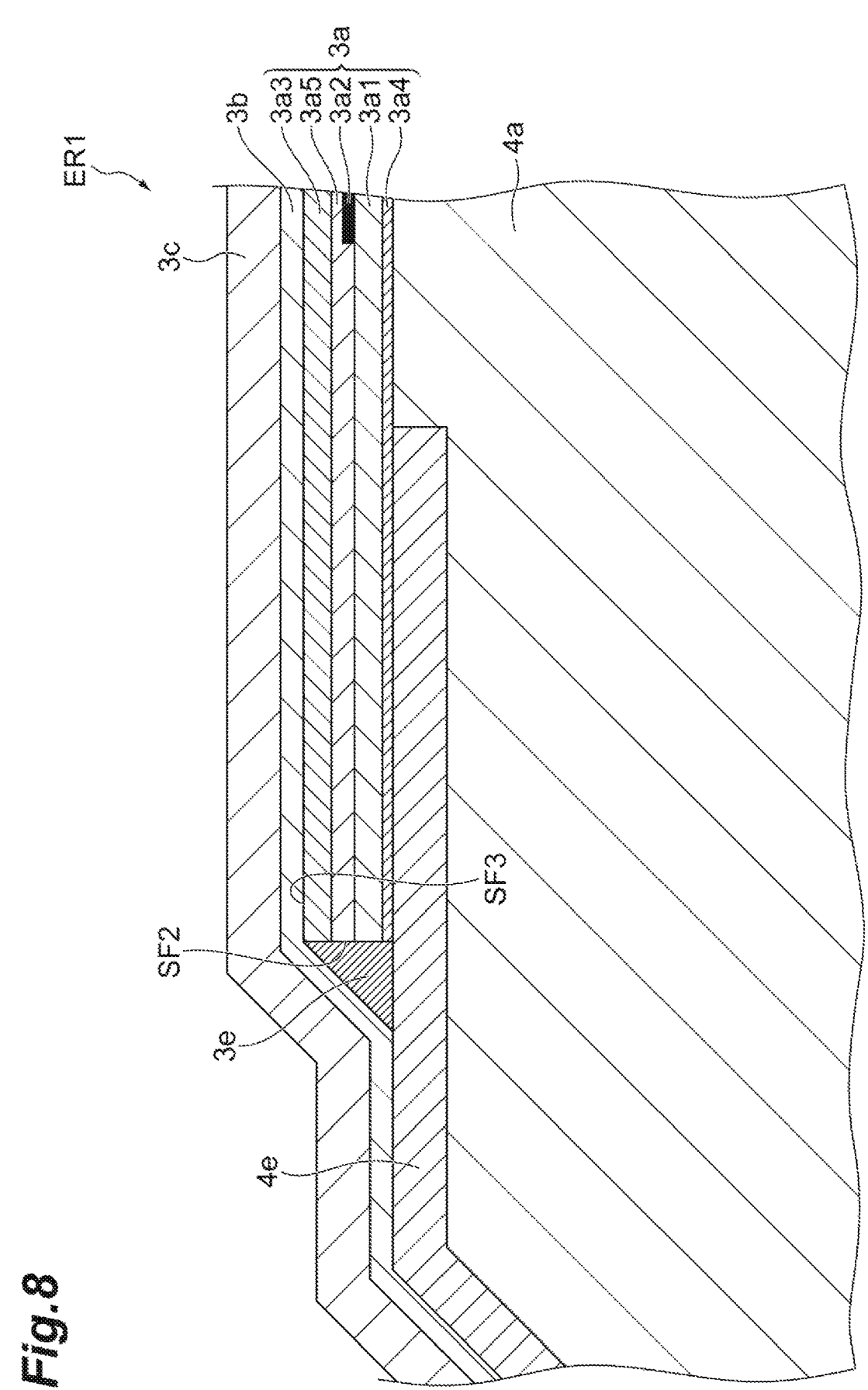
FIG. 8 is a diagram showing another example of the configuration of the end portion of the substrate placing table shown in FIG. 1.

The modification example shown in FIG. 8 will be described. FIG. 8 is a modification example of the configuration of the substrate placing table 2 in the region ER1 shown in FIG. 1. The substrate placing table 2 has a resin region 3e as the end portion region, and the base 4 has the main body part 4a and an insulating region 4e. The insulating region 4e corresponds to the side wall part 4b1 in the region ER1 shown in FIG. 1. The resin region 3e is provided on the insulating region 4e and has a tapered shape that is tapered in a direction separated from the lamination layer portion 3a. The resin region 3e is in contact with the side surface SF2 of the lamination layer portion 3a and the insulating region 4e and covers the side surface SF2. The insulating region 4e is provided on the surface of the main body part 4a. The intermediate layer 3b covers the layer 3a3, the resin region 3e, and the insulating region 4e and is in contact with the layer 3a3, the resin region 3e, and the insulating region 4e. The layer 3a1 is a resin layer, and the material of the layer 3a1 is, for example, any one of polyimide resin, silicone resin, epoxy resin, and acrylic resin (the same applies to the material of the layer 3a1 shown in each of FIGS. 9 to 11 and 14 to 16). The layer 3a3 is a resin layer, and the material of the layer 3a3 is, for example, any one of polyimide resin, silicone resin, epoxy resin, and acrylic resin (the same applies to the material of the layer 3a3 shown in each of FIGS. 9 to 24). The material of the main body part 4a is, for example, SiC (the same applies to the material of the main body part 4a shown in FIGS. 9 to 24).

In the configuration shown in FIG. 8, the diameter of the electrode layer 3a2 is smaller than the diameter of each of the layer 3a1 and the layer 3a3, and the intermediate layer 3b covers the entire surface of the lamination layer portion 3a provided on the base 4 and covers a part of the side wall part 4b2 (the same applies to the configuration of each of FIGS. 9 to 24). Further, in the configuration shown in FIG. 8, the covering layer 3c includes the foundation layer 3c1 and the plurality of protrusion portions 3c2, the foundation layer 3c1 is in close contact with the intermediate layer 3b, and the plurality of protrusion portions 3c2 are provided on the upper surface 31 of the foundation layer 3cl (the same applies to the configuration of each of FIGS. 9 to 24). Further, in the configuration shown in FIG. 8, the surface roughness of the upper surface 31 of the foundation layer 3c1 is in a range of 0.05 to 0.5 µm, and the intermediate layer 3b includes the base body 3b1 and the plurality of granules 3b2 dispersed in the base body 3b1 (the same applies to the configuration of each of FIGS. 9 to 24). Further, in the configuration shown in FIG. 8, the plurality of granules 3b2 include the exposed portions exposed from the base body 3b1, and the exposed portions are in contact with the layer 3a3 and the covering layer 3c (the same applies to the configuration of each of FIGS. 9 to 24). Further, in the configuration shown in FIG. 8, the material of the base body 3b1 contains resin or a silane-based agent, and the material of the granule 3b2 is ceramic (the same applies to the configuration of each of FIGS. 9 to 24).

Figure 9:
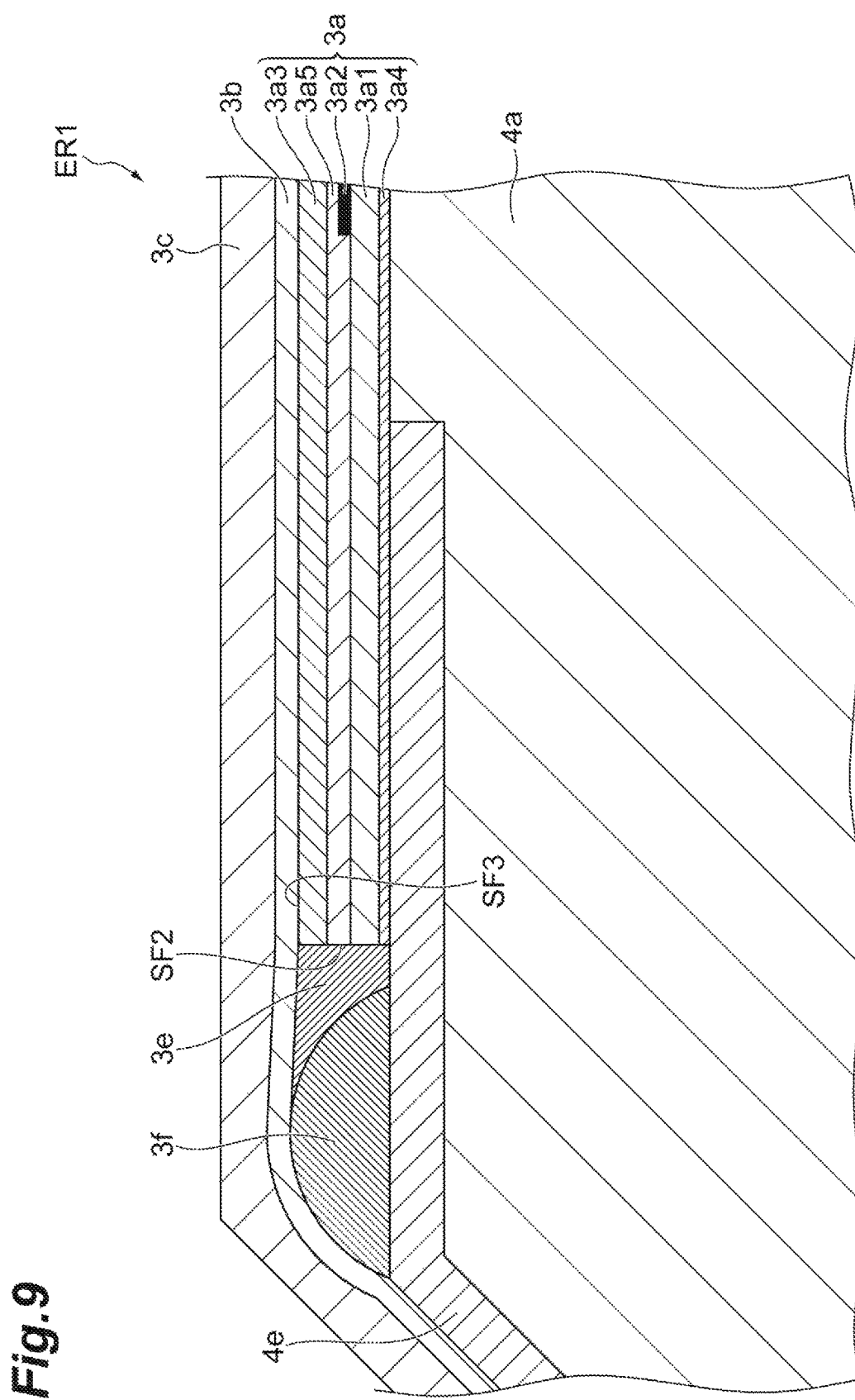
FIG. 9 is a diagram showing another example of the configuration of the end portion of the substrate placing table shown in FIG. 1.

The modification example shown in FIG. 9 will be described. FIG. 9 is a modification example of the configuration of the substrate placing table 2 in the region ER1 shown in FIG. 1. The substrate placing table 2 has the resin region 3e and an insulating region 3f as the end portion regions. The base 4 has the main body part 4a and the insulating region 4e. The insulating region 4e corresponds to the side wall part 4b1 in the region ER1 shown in FIG. 1. The resin region 3e is disposed between the insulating region 3f and the lamination layer portion 3a on the insulating region 4e. The resin region 3e is in contact with the side surface SF2 of the lamination layer portion 3a, the insulating region 3f, and the insulating region 4e and covers the side surface SF2. The insulating region 3f is in contact with the insulating region 4e. The insulating region 4e is provided on the surface of the main body part 4a. The intermediate layer 3b covers the layer 3a3, the resin region 3e, the insulating region 3f, and the insulating region 4e and is in contact with the layer 3a3, the resin region 3e, the insulating region 3f, and the insulating region 4e. The material of the insulating region 3f is an insulating material such as aluminum oxide, for example (the same applies to the material of the insulating region 3f shown in each of FIGS. 11, 15, and 17).

Figure 10:
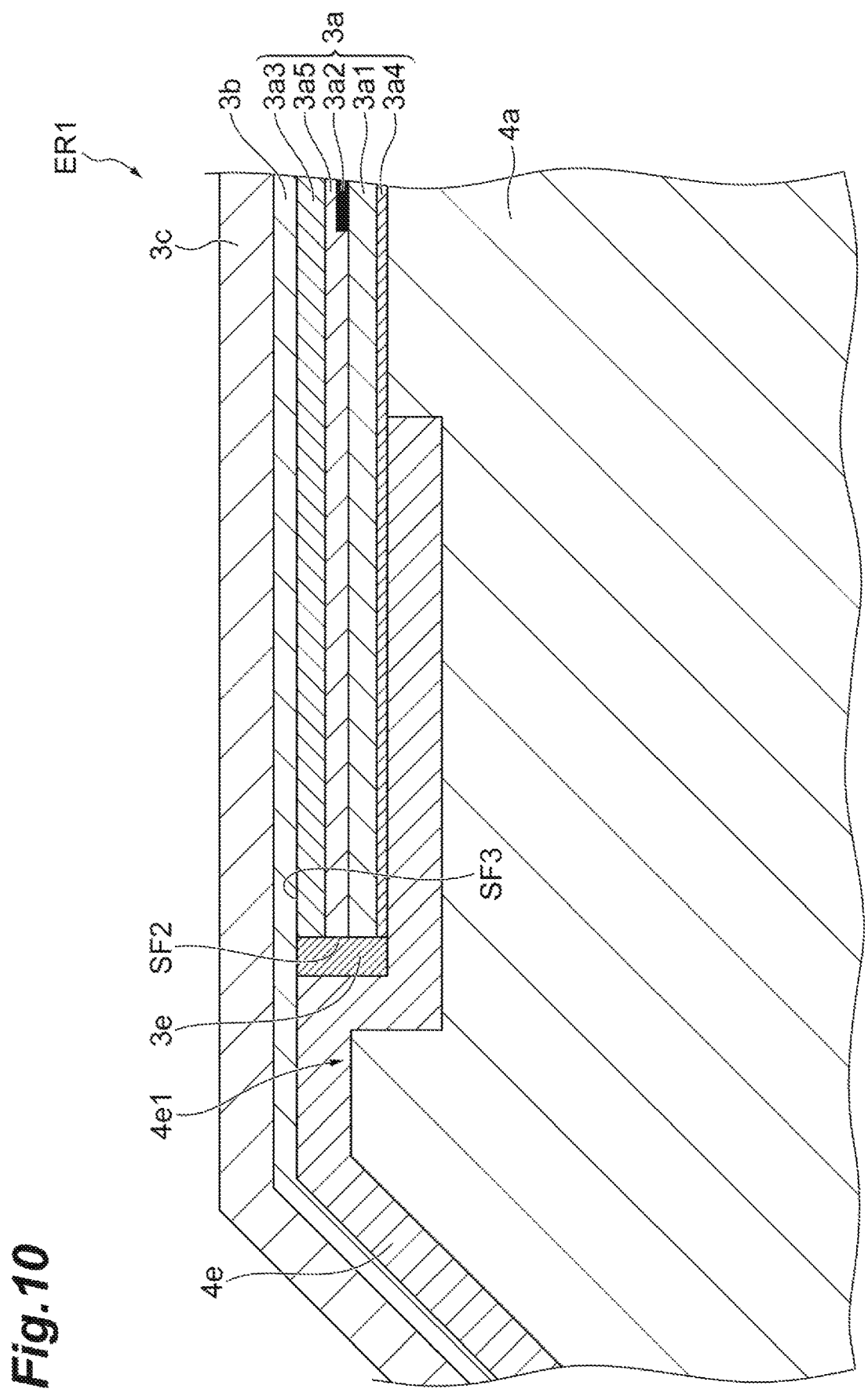
FIG. 10 is a diagram showing another example of the configuration of the end portion of the substrate placing table shown in FIG. 1.

The modification example shown in FIG. 10 will be described. FIG. 10 is a modification example of the configuration of the substrate placing table 2 in the region ER1 shown in FIG. 1. The substrate placing table 2 has the resin region 3e as the end portion region, and the base 4 has the main body part 4a and the insulating region 4e. The insulating region 4e corresponds to the side wall part 4b1 in the region ER1 shown in FIG. 1. The resin region 3e is provided on the insulating region 4e, is in contact with the side surface SF2 of the lamination layer portion 3a and the insulating region 4e, and covers the side surface SF2. The insulating region 4e is provided on the surface of the main body part 4a. The insulating region 4e has a portion (a protrusion portion 4e1) extending along the side surface SF2 of the electrostatic chuck 3. The resin region 3e is provided between the side surface SF2 of the lamination layer portion 3a and the protrusion portion 4e1 of the insulating region 4e. The intermediate layer 3b covers the layer 3a3, the resin region 3e, and the insulating region 4e and is in contact with the layer 3a3, the resin region 3e, and the insulating region 4e.

Figure 11:
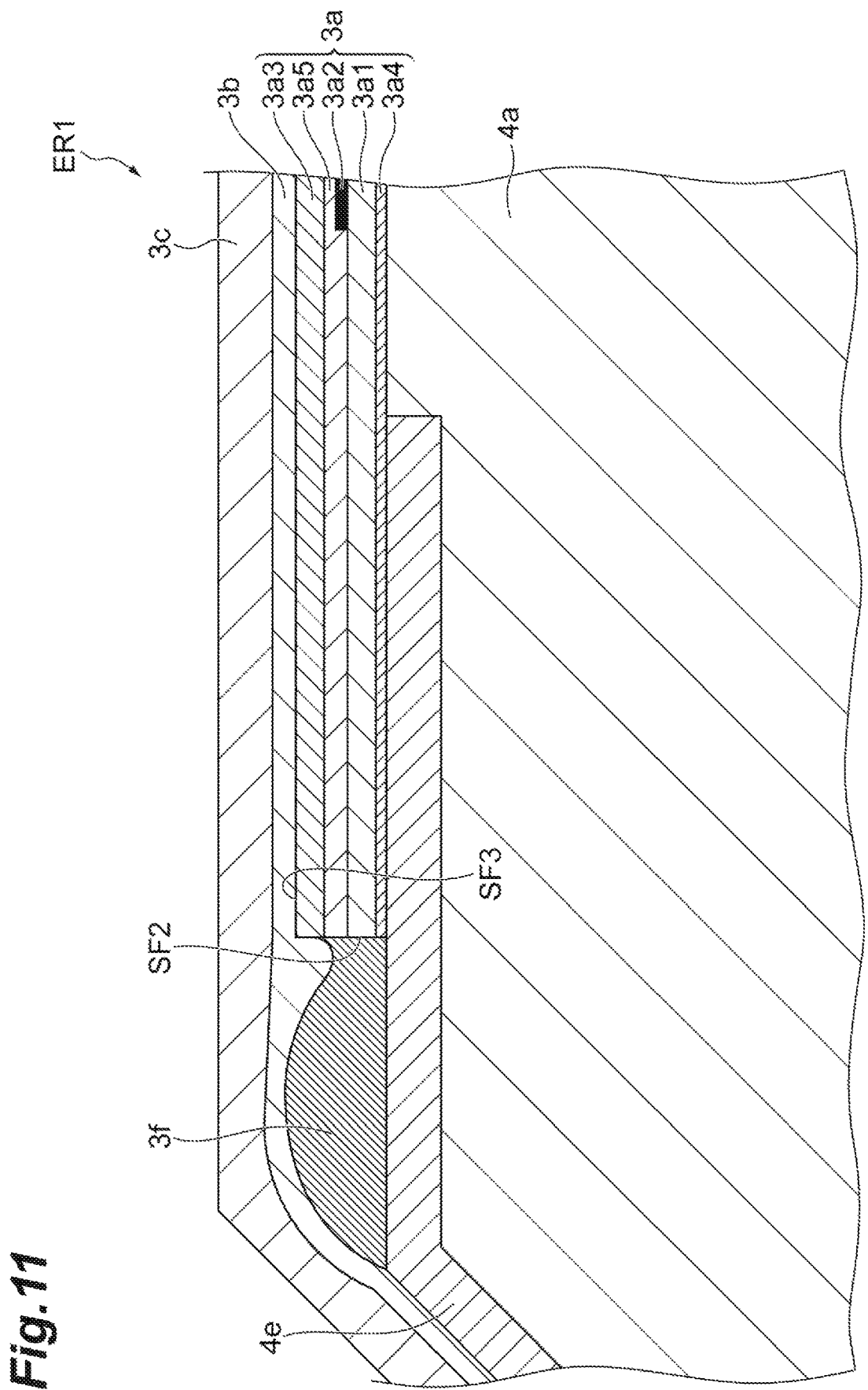
FIG. 11 is a diagram showing another example of the configuration of the end portion of the substrate placing table shown in FIG. 1.

The modification example shown in FIG. 11 will be described. FIG. 11 is a modification example of the configuration of the substrate placing table 2 in the region ER1 shown in FIG. 1. The substrate placing table 2 has the insulating region 3f as the end portion region, and the base 4 has the main body part 4a and the insulating region 4e. The insulating region 4e corresponds to the side wall part 4b1 in the region ER1 shown in FIG. 1. The insulating region 3f is provided on the insulating region 4e, is in contact with the side surface SF2 of the lamination layer portion 3a and the insulating region 4e, and covers the side surface SF2. The insulating region 4e is provided on the surface of the main body part 4a. The intermediate layer 3b covers the layer 3a3, the insulating region 3f, and the insulating region 4e and is in contact with the layer 3a3, the insulating region 3f, and the insulating region 4e.

Figure 12:
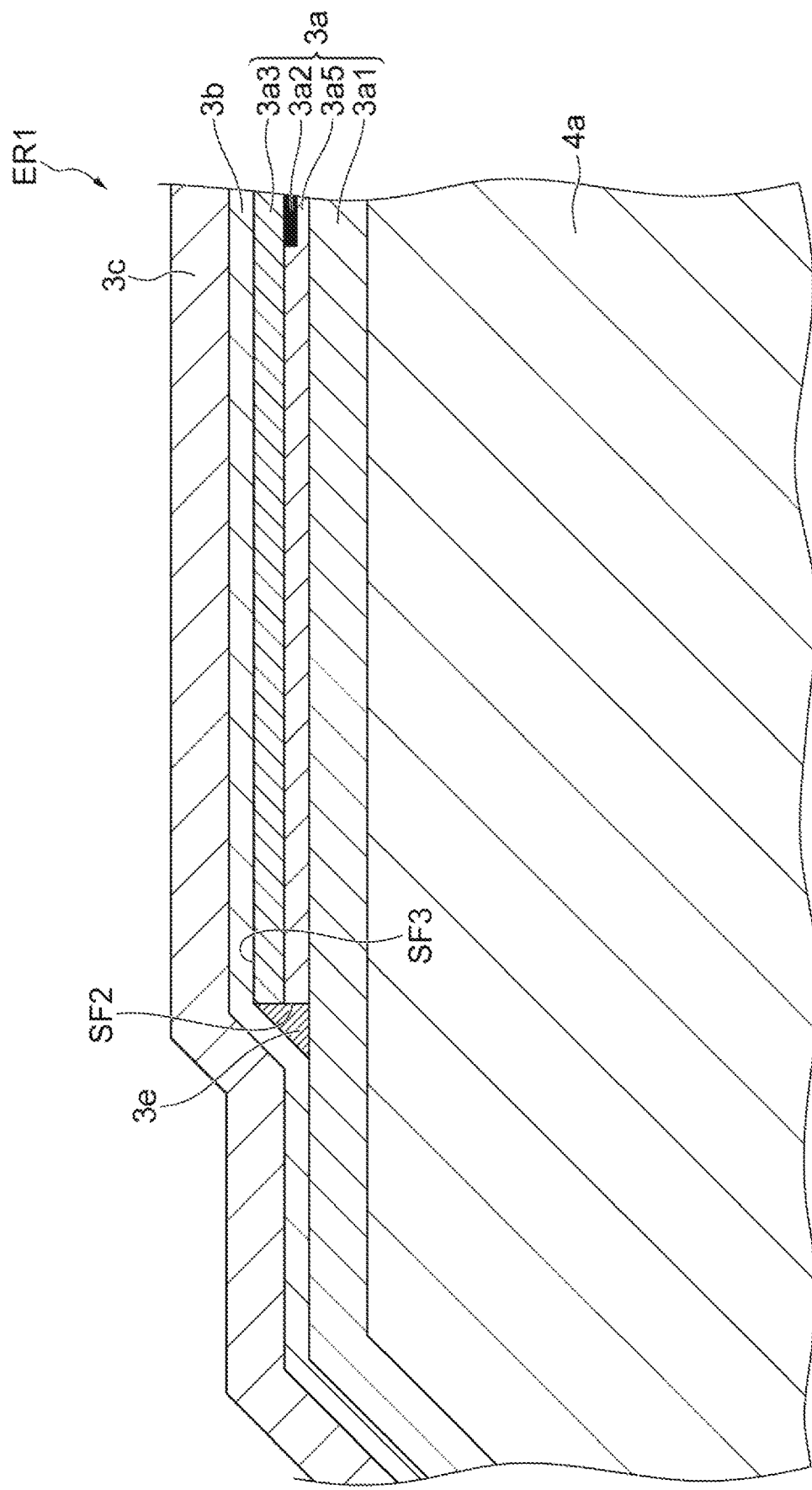
FIG. 12 is a diagram showing another example of the configuration of the end portion of the substrate placing table shown in FIG. 1.

The modification example shown in FIG. 12 will be described. FIG. 12 is a modification example of the configuration of the substrate placing table 2 in the region ER1 shown in FIG. 1. The substrate placing table 2 has the resin region 3e as the end portion region, and the base 4 has the main body part 4a. The lamination layer portion 3a shown in FIG. 12 has the layer 3a1, the adhesion layer 3a5 and the electrode layer 3a2 provided on the layer 3a1, and the layer 3a3 provided on the adhesion layer 3a5 and the electrode layer 3a2. The lamination layer portion 3a shown in FIG. 12 does not have the adhesion layer 3a4 shown in FIG. 8 and the like. The layer 3a1 is provided on the main body part 4a and covers the surface of the main body part 4a. The resin region 3e is provided on the layer 3a1, is in contact with the side surface SF2 and the layer 3a1 of the lamination layer portion 3a, covers the side surface SF2, and has a tapered shape that is tapered in a direction separated from the lamination layer portion 3a. The intermediate layer 3b covers the layer 3a3, the resin region 3e, and the layer 3a1 and is in contact with the layer 3a3, the resin region 3e, and the layer 3a1. The layer 3a1 is an insulating layer or a resin layer (the same applies to the layer 3a1 shown in each of FIGS. 13 and 17 to 24). The material of the layer 3a1 in a case where the layer 3a1 is an insulating film is ceramic, and the material of the layer 3a1 in a case where the layer 3a1 is a resin layer is any one of polyimide resin, silicone resin, epoxy resin, and acrylic resin. Such a material of the layer 3a1 is also the same with respect to the material of the layer 3a1 shown in each of FIGS. 13 and 17 to 24.

Figure 13:
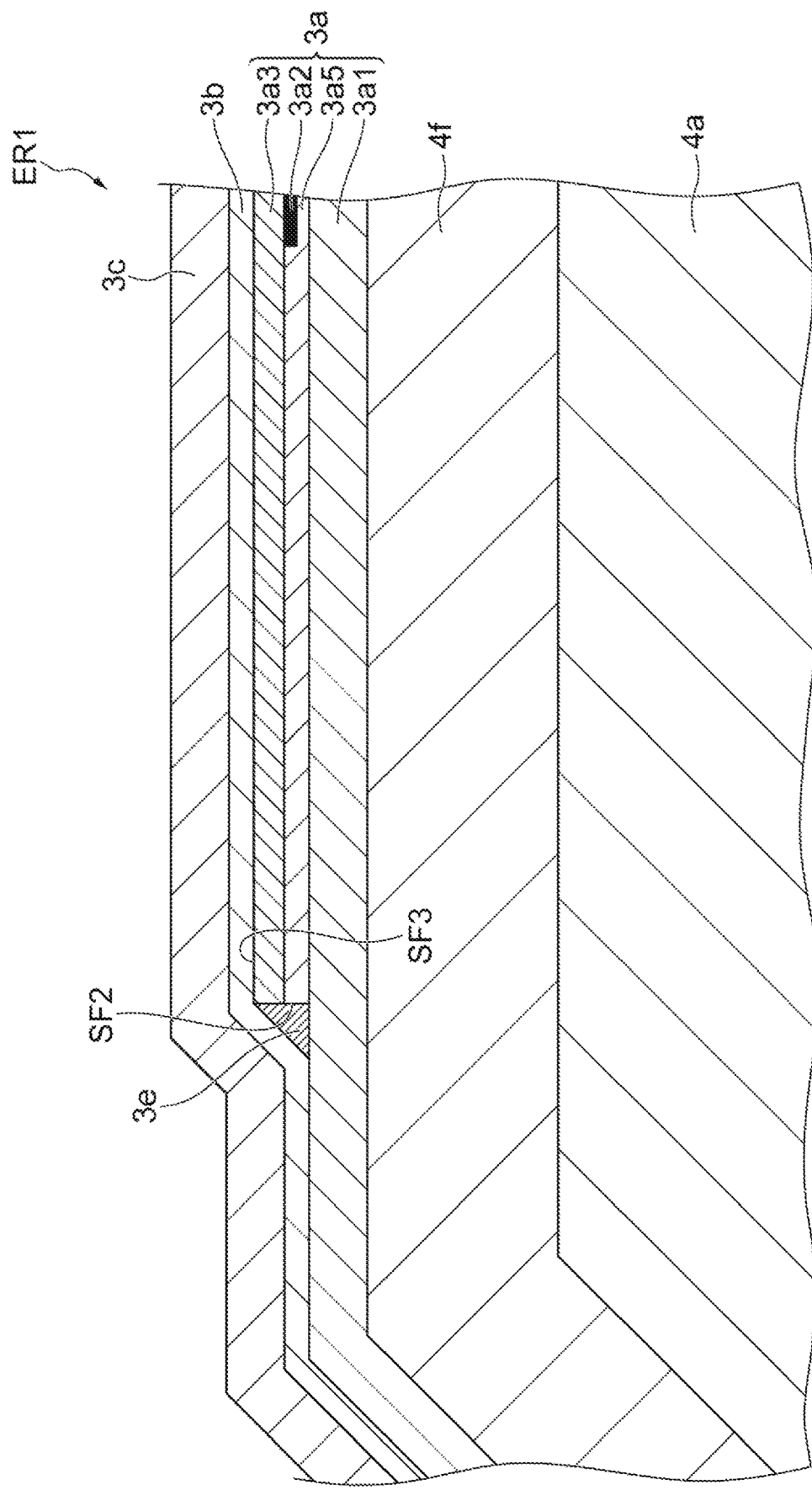
FIG. 13 is a diagram showing another example of the configuration of the end portion of the substrate placing table shown in FIG. 1.

The modification example shown in FIG. 13 will be described. FIG. 13 is a modification example of the configuration of the substrate placing table 2 in the region ER1 shown in FIG. 1. The base 4 of the substrate placing table 2 shown in FIG. 13 has a conductive region 4f, and the configuration of the substrate placing table 2 shown in FIG. 13 is different from the configuration of the substrate placing table 2 shown in FIG. 12 in that the conductive region 4f is provided. The conductive region 4f is provided on the main body part 4a and is in contact with the main body part 4a. The layer 3a1 is provided on the conductive region 4f and is in contact with the conductive region 4f. The material of the conductive region 4f is a conductive material such as aluminum or copper (the same applies to the material of the conductive region 4f shown in each of FIGS. 14 and 21 to 24).

Figure 14:
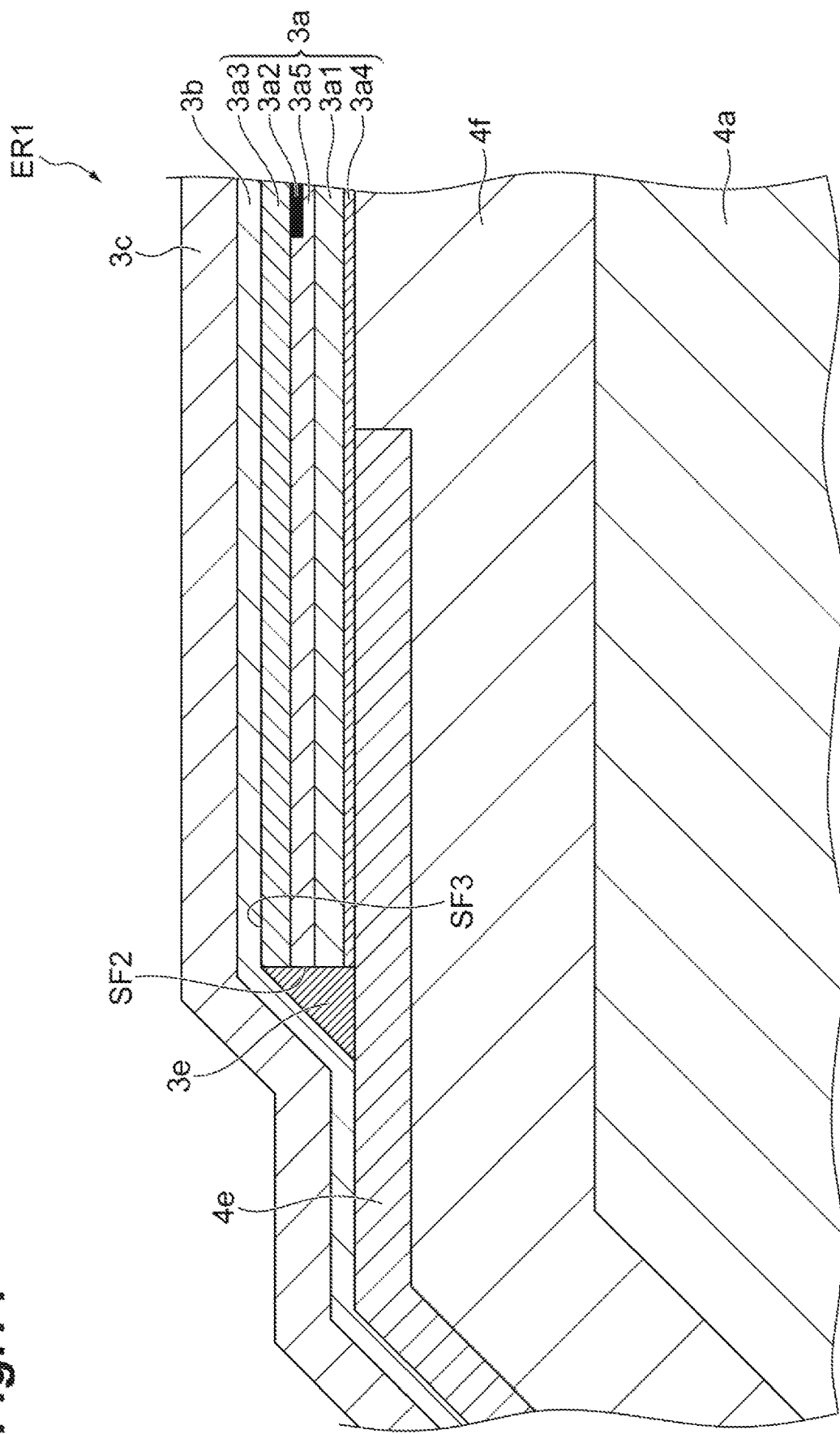
FIG. 14 is a diagram showing another example of the configuration of the end portion of the substrate placing table shown in FIG. 1.

The modification example shown in FIG. 14 will be described. FIG. 14 is a modification example of the configuration of the substrate placing table 2 in the region ER1 shown in FIG. 1. The configuration of the substrate placing table 2 shown in FIG. 14 has the conductive region 4f, and the configuration of the substrate placing table 2 shown in FIG. 14 is different from the configuration of the substrate placing table 2 shown in FIG. 8 in that the conductive region 4f is provided. The conductive region 4f is provided on the main body part 4a and is in contact with the main body part 4a. The insulating region 4e is provided on the conductive region 4f and is in contact with the conductive region 4f. The insulating region 4e corresponds to the side wall part 4b1 in the region ER1 shown in FIG. 1.

The configuration shown in FIG. 14 in which the conductive region 4f is provided is also the same in FIGS. 9 to 11.

Figure 15:
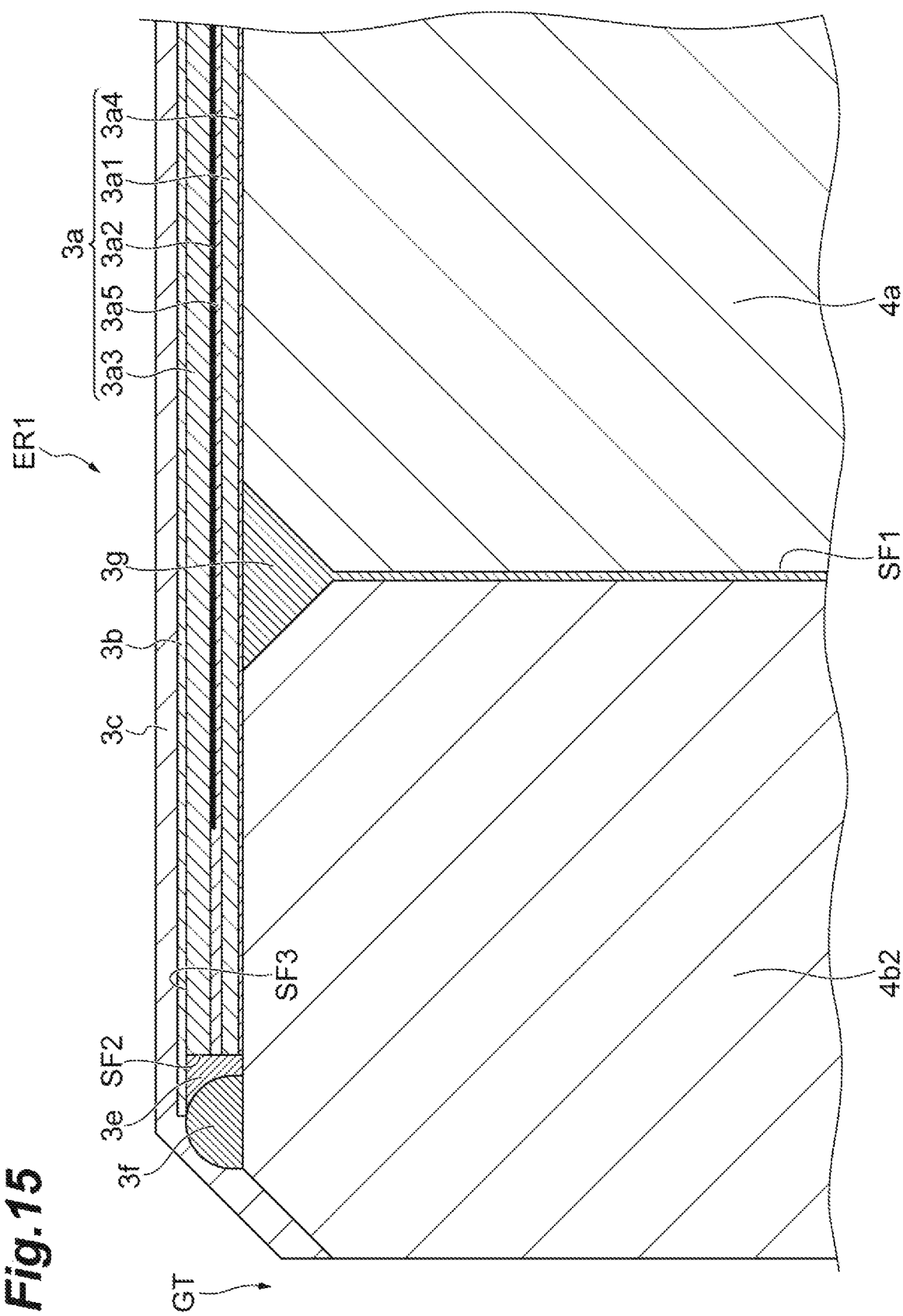
FIG. 15 is a diagram showing another example of the configuration of the end portion of the substrate placing table shown in FIG. 1.

The modification example shown in FIG. 15 will be described. FIG. 15 is a modification example of the configuration of the substrate placing table 2 in the region ER1 facing the hole GT. The substrate placing table 2 has the resin region 3e and the insulating region 3f as the end portion regions, and a resin region 3g. The base 4 includes the main body part 4a and the side wall part 4b2 provided on the side surface of the base 4. The electrostatic chuck 3 is disposed on the main body part 4a and the side wall part 4b2. The inner diameter of each of the layer 3a1 and the layer 3a3 (the diameter of the region including the hole GT and defined by the side surface SF2) is smaller than the inner diameter of the main body part 4*a* (the diameter of the region including the hole GT and defined by the side surface SF1). The layer 3*a*1 and the layer 3*a*3 extend on the base 4 so as to overlap the side wall part 4*b*2. The resin region 3*g* is provided between the main body part 4*a* and the side wall part 4*b*2 and is in contact with the adhesion layer 3*a*4. The resin region 3*g* extends so as to expand toward the lamination layer portion 3*a* in the vicinity of the lamination layer portion 3*a*. The resin region 3*e* is in contact with the side surface SF2 of the lamination layer portion 3*a* and the side wall part 4*b*2 and covers the side surface SF2. The insulating region 3*f* is in contact with the side wall part 4*b*2. The resin region 3*e* is disposed between the insulating region 3*f* and the lamination layer portion 3*a* on the side wall part 4*b*2 and is in contact with the insulating region 3*f* and the lamination layer portion 3*a*. The intermediate layer 3*b* covers the layer 3*a*3 and the resin region 3*e* and is in contact with the layer 3*a*3 and the resin region 3*e*.

Figure 16:
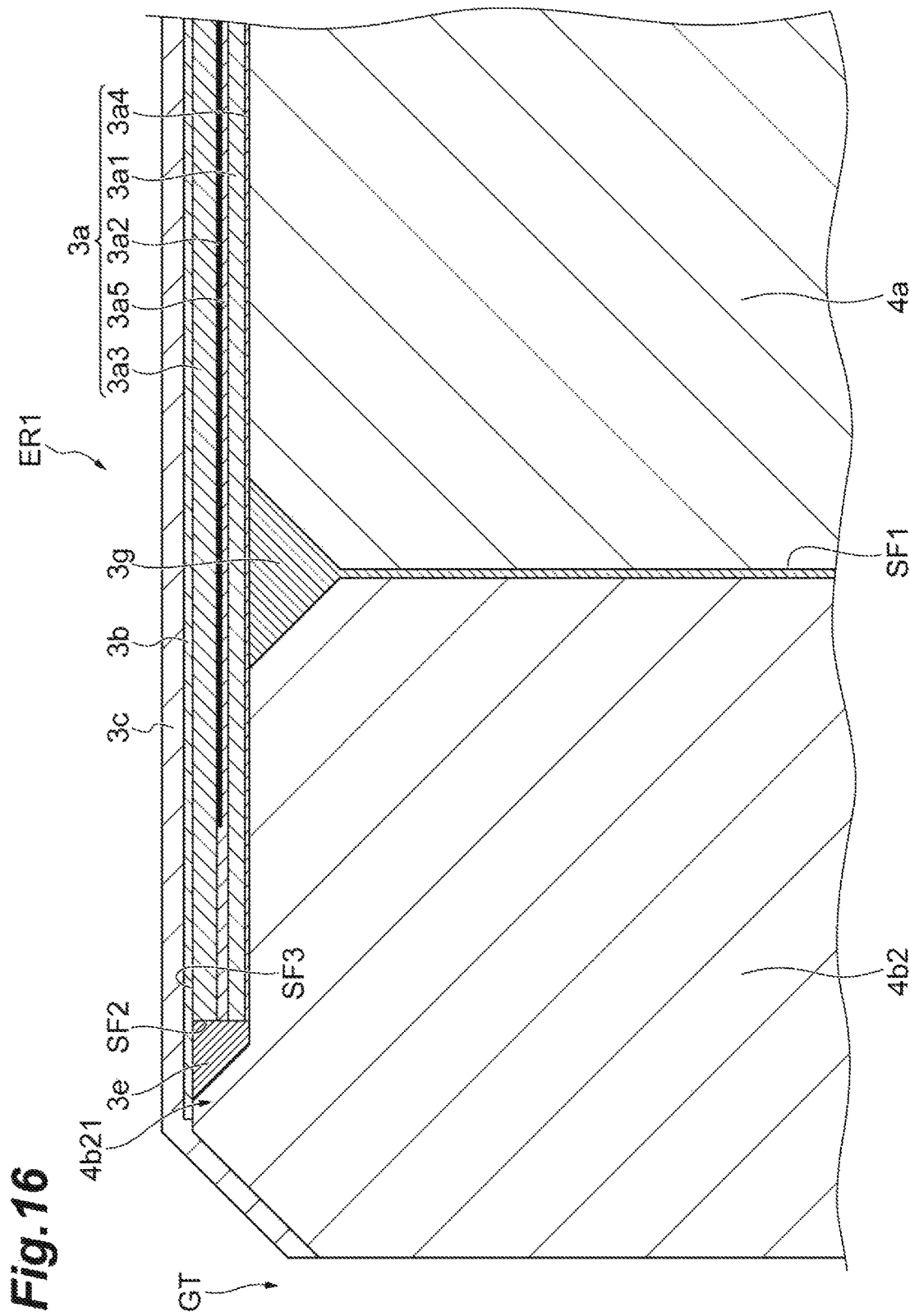
FIG. 16 is a diagram showing another example of the configuration of the end portion of the substrate placing table shown in FIG. 1.

The modification example shown in FIG. 16 will be described. FIG. 16 is a modification example of the configuration of the substrate placing table 2 in the region ER1 facing the hole GT. The substrate placing table 2 has the resin region 3*e* as the end portion region, and the resin region 3*g*. The base 4 includes the main body part 4*a* and the side wall part 4*b*2 provided on the side surface of the base 4. The electrostatic chuck 3 is disposed on the main body part 4*a* and the side wall part 4*b*2. The inner diameter of each of the layer 3*a*1 and the layer 3*a*3 (the diameter of the region including the hole GT and defined by the side surface SF2) is smaller than the inner diameter of the main body part 4*a* (the diameter of the region including the hole GT and defined by the side surface SF1). The layer 3*a*1 and the layer 3*a*3 extend on the base 4 so as to overlap the side wall part 4*b*2. The resin region 3*g* is provided between the main body part 4*a* and the side wall part 4*b*2 and is in contact with the adhesion layer 3*a*4. The resin region 3*g* extends so as to expand toward the lamination layer portion 3*a* in the vicinity of the lamination layer portion 3*a*. The surface of the side wall part 4*b*2 has a portion which is in contact with the lamination layer portion 3*a*, and a portion extending along the side surface SF2 of the lamination layer portion 3*a* (a part of the surface of a protrusion portion 4*b*21 which is included in the side wall part 4*b*2). The resin region 3*e* is provided between the side surface SF2 of the lamination layer portion 3*a* and the portion of the surface of the side wall part 4*b*2 (a part of the surface of the protrusion portion 4*b*21). The resin region 3*e* is in contact with the side surface SF2 of the lamination layer portion 3*a* and the side wall part 4*b*2 (in particular, the protrusion portion 4*b*21) and covers the side surface SF2. The intermediate layer 3*b* covers the layer 3*a*3 and the resin region 3*e* and is in contact with the layer 3*a*3 and the resin region 3*e*.

Figure 17:
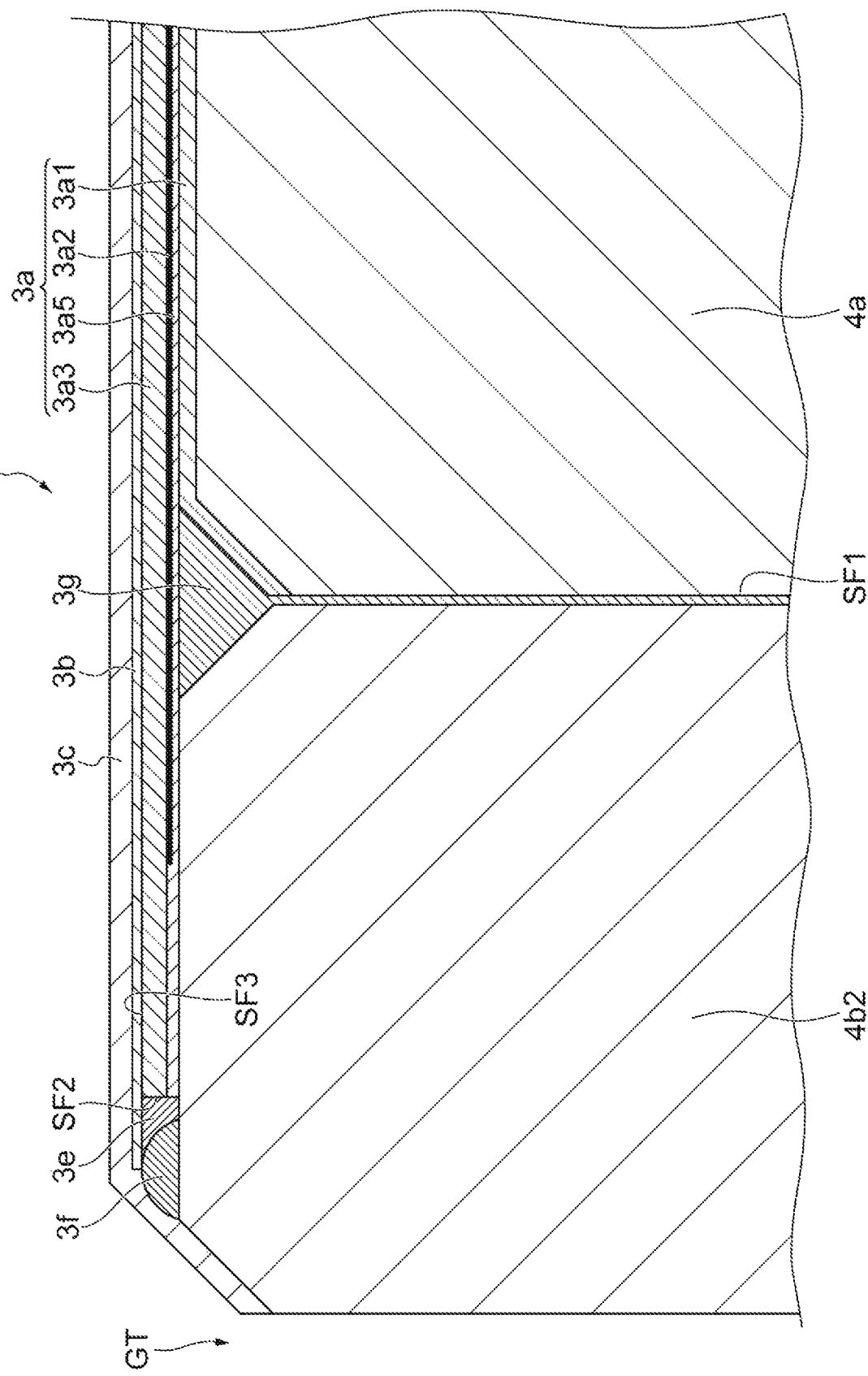
FIG. 17 is a diagram showing another example of the configuration of the end portion of the substrate placing table shown in FIG. 1.

The modification example shown in FIG. 17 will be described. FIG. 17 is a modification example of the configuration of the substrate placing table 2 in the region ER1 facing the hole GT. The substrate placing table 2 has the resin region 3*e* and the insulating region 3*f* as the end portion regions, and the resin region 3*g*. The lamination layer portion 3*a* shown in FIG. 17 has the layer 3*a*1, the adhesion layer 3*a*5 and the electrode layer 3*a*2 provided on the layer 3*a*1, and the layer 3*a*3 provided on the adhesion layer 3*a*5 and the electrode layer 3*a*2. The lamination layer portion 3*a* shown in FIG. 17 does not have the adhesion layer 3*a*4 shown in FIG. 8 and the like. The layer 3*a*1 is provided on the main body part 4*a* and covers the surface of the main body part 4*a*. The base 4 includes the main body part 4*a* and the side wall part 4*b*2 provided on the side surface of the base 4. The electrostatic chuck 3 is disposed on the main body part 4*a* and the side wall part 4*b*2. The inner diameter of the layer 3*a*3 (the diameter of the region including the hole GT and defined by the side surface SF2) is smaller than the inner diameter of the main body part 4*a* (the diameter of the region including the hole GT and defined by the side surface SF1). The layer 3*a*3 extends on the base 4 so as to overlap the side wall part 4*b*2. The resin region 3*g* is provided between the main body part 4*a* and the side wall part 4*b*2 and is in contact with the adhesion layer 3*a*5. The resin region 3*g* extends so as to expand toward the lamination layer portion 3*a* in the vicinity of the lamination layer portion 3*a*. The resin region 3*e* is in contact with the side surface SF2 of the lamination layer portion 3*a* and the side wall part 4*b*2 and covers the side surface SF2. The insulating region 3*f* is in contact with the side wall part 4*b*2. The resin region 3*e* is disposed between the insulating region 3*f* and the lamination layer portion 3*a* on the side wall part 4*b*2 and is in contact with the insulating region 3*f* and the lamination layer portion 3*a*. The intermediate layer 3*b* covers the layer 3*a*3 and the resin region 3*e* and is in contact with the layer 3*a*3 and the resin region 3*e*.

Figure 18:
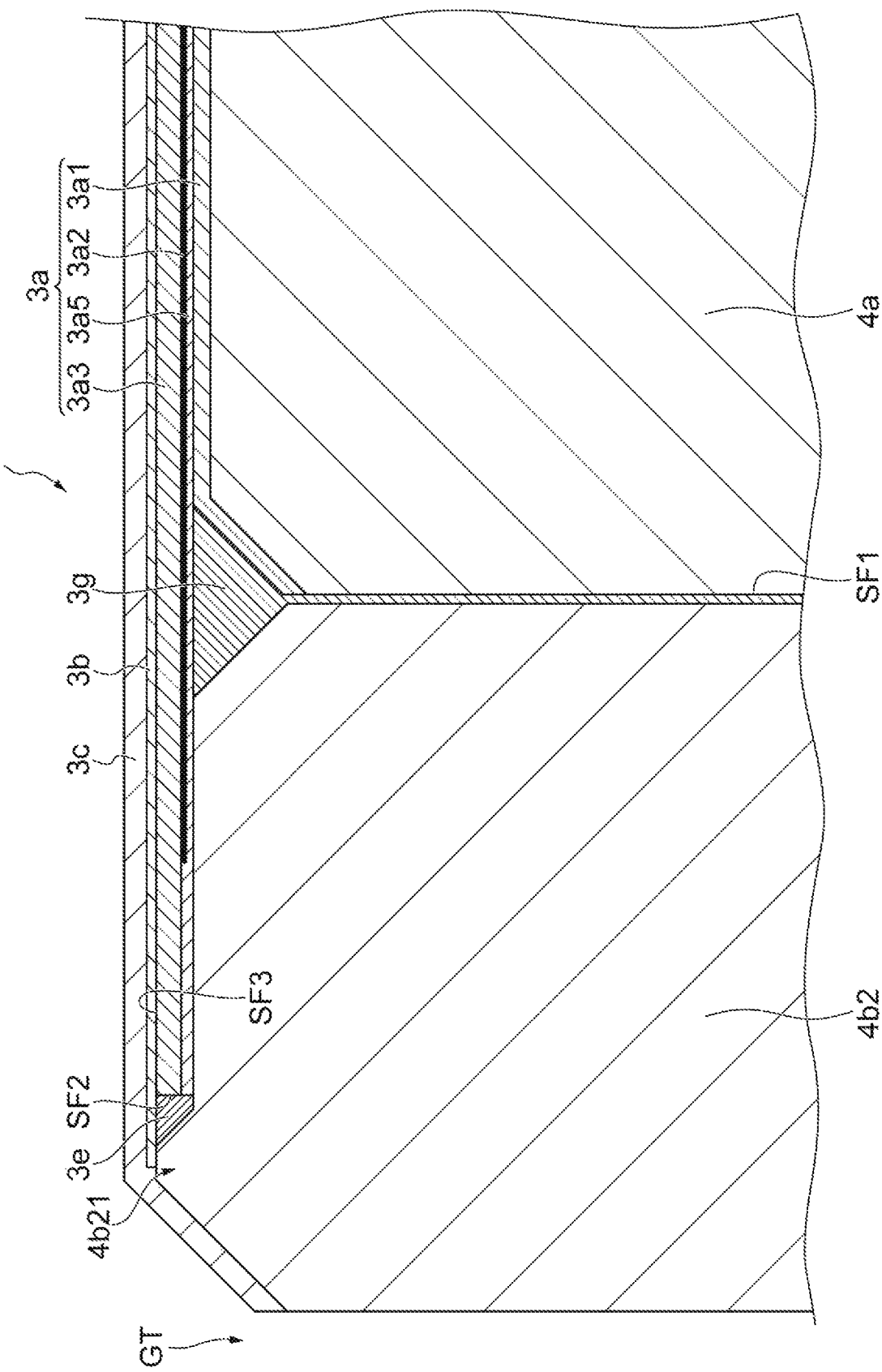
FIG. 18 is a diagram showing another example of the configuration of the end portion of the substrate placing table shown in FIG. 1.

The modification example shown in FIG. 18 will be described. FIG. 18 is a modification example of the configuration of the substrate placing table 2 in the region ER1 facing the hole GT. The substrate placing table 2 has the resin region 3*e* as the end portion region, and the resin region 3*g*. The lamination layer portion 3*a* shown in FIG. 18 has the layer 3*a*1, the adhesion layer 3*a*5 and the electrode layer 3*a*2 provided on the layer 3*a*1, and the layer 3*a*3 provided on the adhesion layer 3*a*5 and the electrode layer 3*a*2. The lamination layer portion 3*a* shown in FIG. 18 does not have the adhesion layer 3*a*4 shown in FIG. 8 and the like. The layer 3*a*1 is provided on the main body part 4*a* and covers the surface of the main body part 4*a*. The base 4 includes the main body part 4*a* and the side wall part 4*b*2 provided on the side surface of the base 4. The electrostatic chuck 3 is disposed on the main body part 4*a* and the side wall part 4*b*2. The inner diameter of the layer 3*a*3 (the diameter of the region including the hole GT and defined by the side surface SF2) is smaller than the inner diameter of the main body part 4*a* (the diameter of the region including the hole GT and defined by the side surface SF1). The layer 3*a*3 extends on the base 4 so as to overlap the side wall part 4*b*2. The resin region 3*g* is provided between the main body part 4*a* and the side wall part 4*b*2 and is in contact with the adhesion layer 3*a*5. The resin region 3*g* extends so as to expand toward the lamination layer portion 3*a* in the vicinity of the lamination layer portion 3*a*. The surface of the side wall part 4*b*2 has a portion which is in contact with the lamination layer portion 3*a*, and a portion extending along the side surface SF2 of the lamination layer portion 3*a* (a part of the surface of the protrusion portion 4*b*21 which is included in the side wall part 4*b*2). The resin region 3*e* is provided between the side surface SF2 of the lamination layer portion 3*a* and the portion of the surface of the side wall part 4*b*2 (a part of the surface of the protrusion portion 4*b*21). The resin region 3*e* is in contact with the side surface SF2 of the lamination layer portion 3*a* and the side wall part 4*b*2 (in particular, the protrusion portion 4*b*21) and covers the side surface SF2. The intermediate layer 3*b* covers the layer 3*a*3 and the resin region 3*e* and is in contact with the layer 3*a*3 and the resin region 3*e*.

Figure 19:
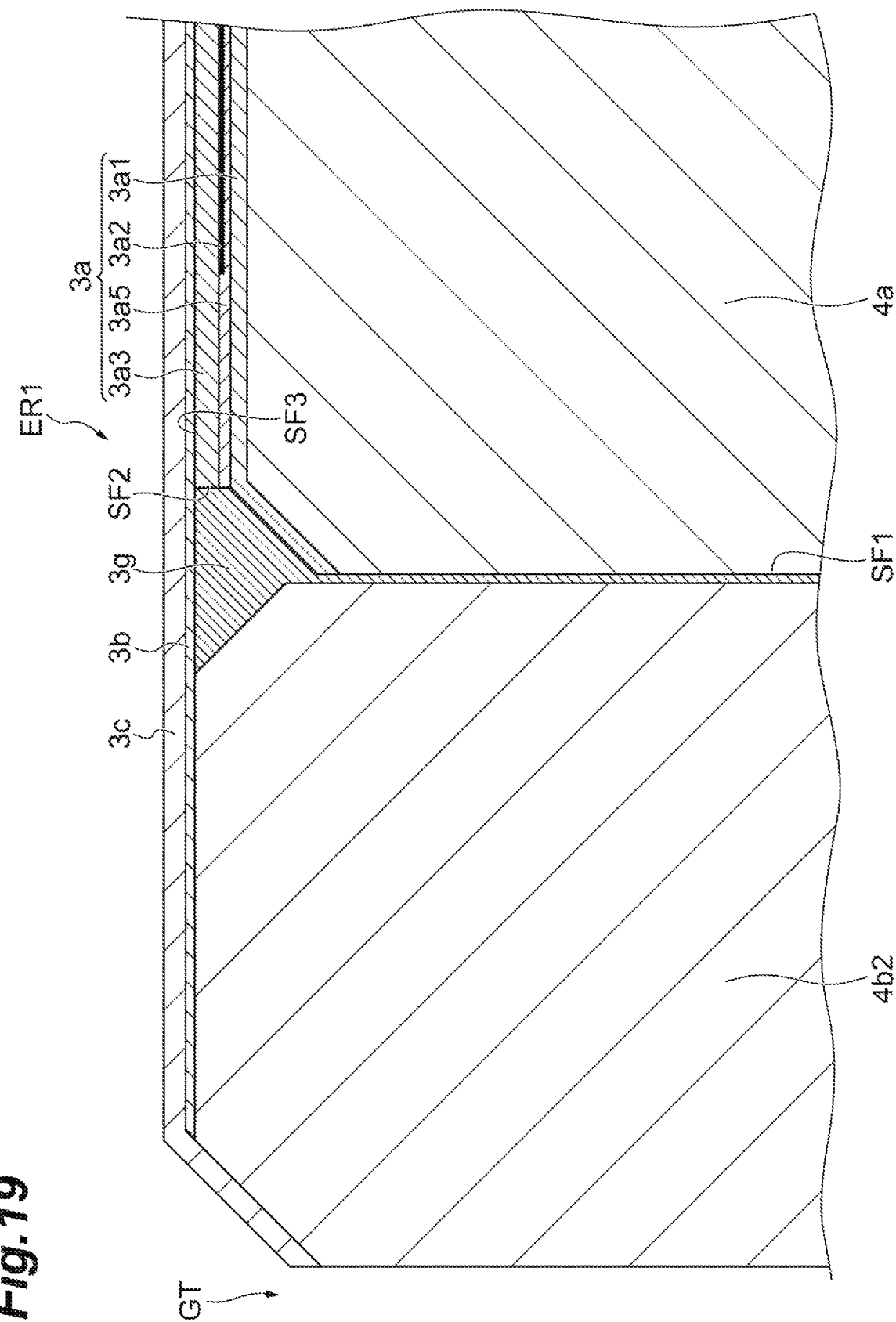
FIG. 19 is a diagram showing another example of the configuration of the end portion of the substrate placing table shown in FIG. 1.

The modification example shown in FIG. 19 will be described. FIG. 19 is a modification example of the configuration of the substrate placing table 2 in the region ER1 facing the hole GT. The substrate placing table 2 has the resin region 3g as the end portion region. The lamination layer portion 3a shown in FIG. 19 has the layer 3a1, the adhesion layer 3a5 and the electrode layer 3a2 provided on the layer 3a1, and the layer 3a3 provided on the adhesion layer 3a5 and the electrode layer 3a2. The lamination layer portion 3a shown in FIG. 19 does not have the adhesion layer 3a4 shown in FIG. 8 and the like. The layer 3a1 is provided on the main body part 4a and covers the surface of the main body part 4a. The base 4 includes the main body part 4a and the side wall part 4b2 provided on the side surface of the base 4. The electrostatic chuck 3 is disposed on the main body part 4a and the side wall part 4b2. The inner diameter of the layer 3a3 (the diameter of the region including the hole GT and defined by the side surface SF2) is larger than the inner diameter of the main body part 4a (the diameter of the region including the hole GT and defined by the side surface SF1). The layer 3a3 does not overlap the side wall part 4b2 and extends only on the main body part 4a. The resin region 3g is provided between the main body part 4a and the side wall part 4b2, is in contact with the intermediate layer 3b and the side surface SF2 of the lamination layer portion 3a, and covers the side surface SF2. The resin region 3g extends so as to expand toward the intermediate layer 3b in the vicinity of the intermediate layer 3b. The intermediate layer 3b covers the layer 3a3, the resin region 3g, and the side wall part 4b2 and is in contact with the layer 3a3, the resin region 3g, and the side wall part 4b2.

Figure 20:
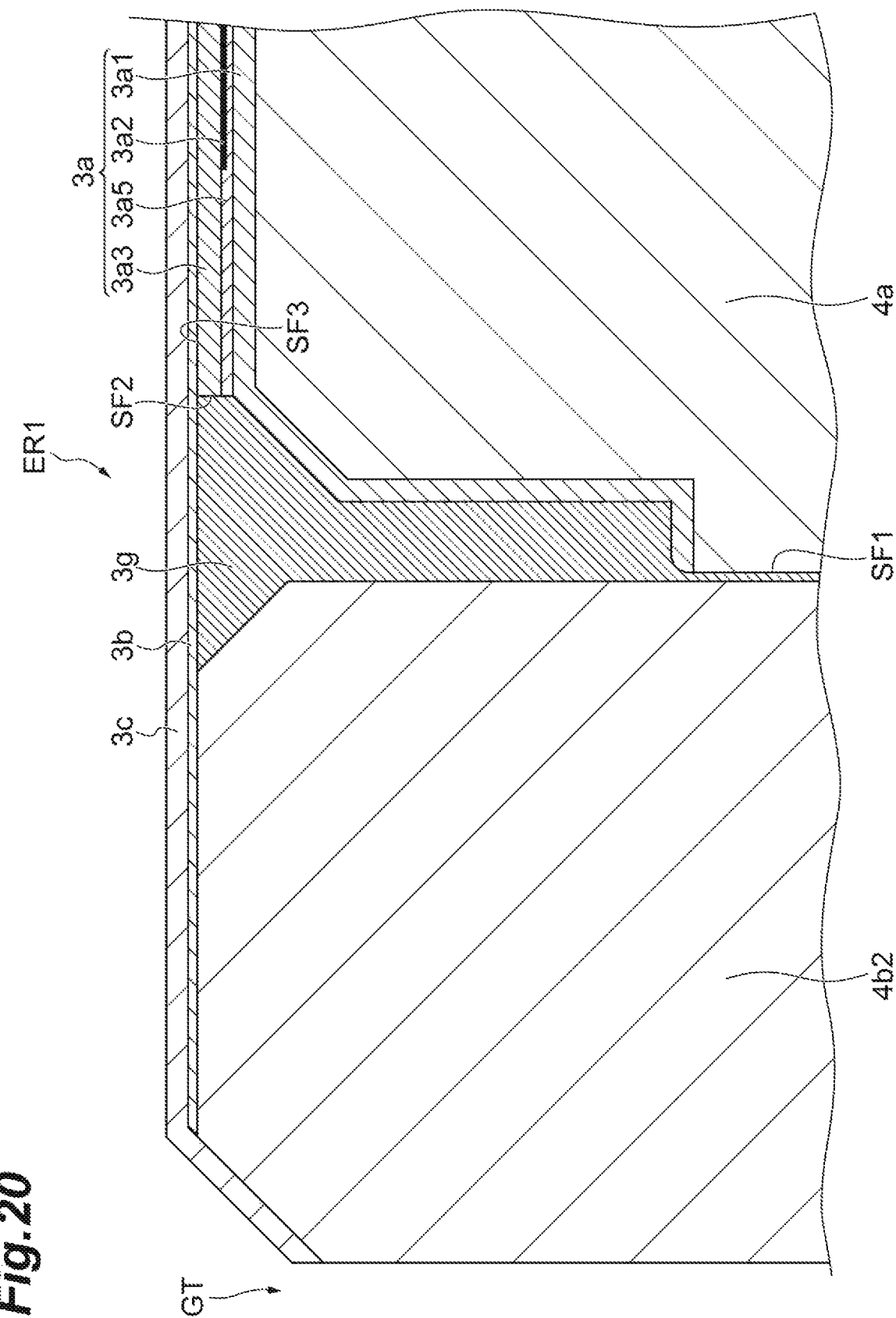
FIG. 20 is a diagram showing another example of the configuration of the end portion of the substrate placing table shown in FIG. 1.

The modification example shown in FIG. 20 will be described. FIG. 20 is a modification example of the configuration of the substrate placing table 2 in the region ER1 facing the hole GT. The substrate placing table 2 has the resin region 3g as the end portion region. The resin region 3g is provided between the main body part 4a and the side wall part 4b2 and is in contact with the intermediate layer 3b. The distance between the main body part 4a and the side wall part 4b2 (the width of the resin region 3g) is increased in stages toward the intermediate layer 3b. The configuration of the substrate placing table 2 shown in FIG. 20 is different from the configuration of the substrate placing table 2 shown in FIG. 19 in terms of the distance between the main body part 4a and the side wall part 4b2 (the width of the resin region 3g) as described above.

Figure 21:
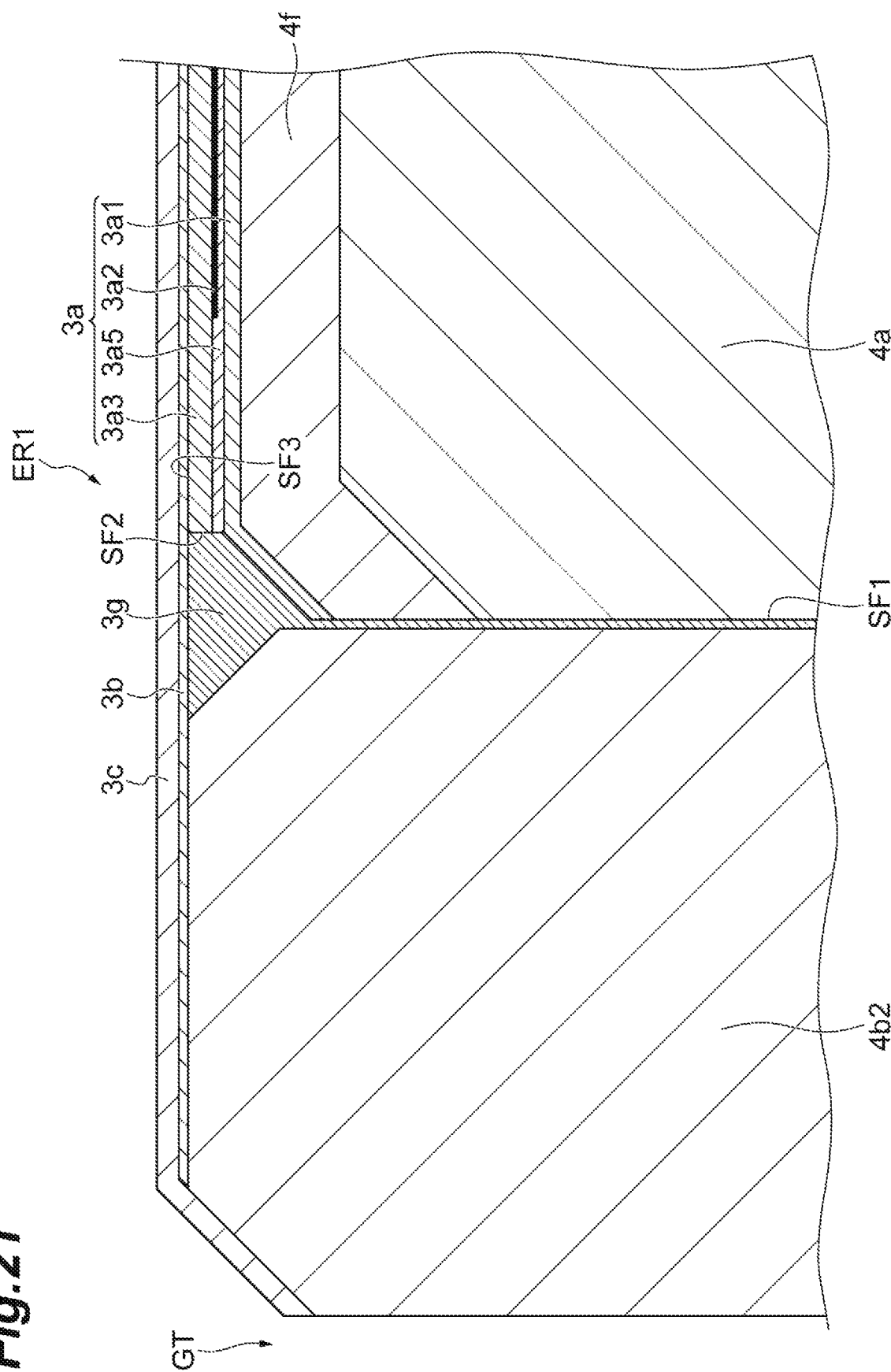
FIG. 21 is a diagram showing another example of the configuration of the end portion of the substrate placing table shown in FIG. 1.

The modification example shown in FIG. 21 will be described. FIG. 21 is a modification example of the configuration of the substrate placing table 2 in the region ER1 facing the hole GT. The configuration of the substrate placing table 2 shown in FIG. 21 has the conductive region 4f, and the configuration of the substrate placing table 2 shown in FIG. 21 is different from the configuration of the substrate placing table 2 shown in FIG. 19 in that the conductive region 4f is provided. The conductive region 4f is provided on the main body part 4a and is in contact with the main body part 4a. The layer 3a1 is provided on the conductive region 4f and is in contact with the conductive region 4f.

Figure 22:
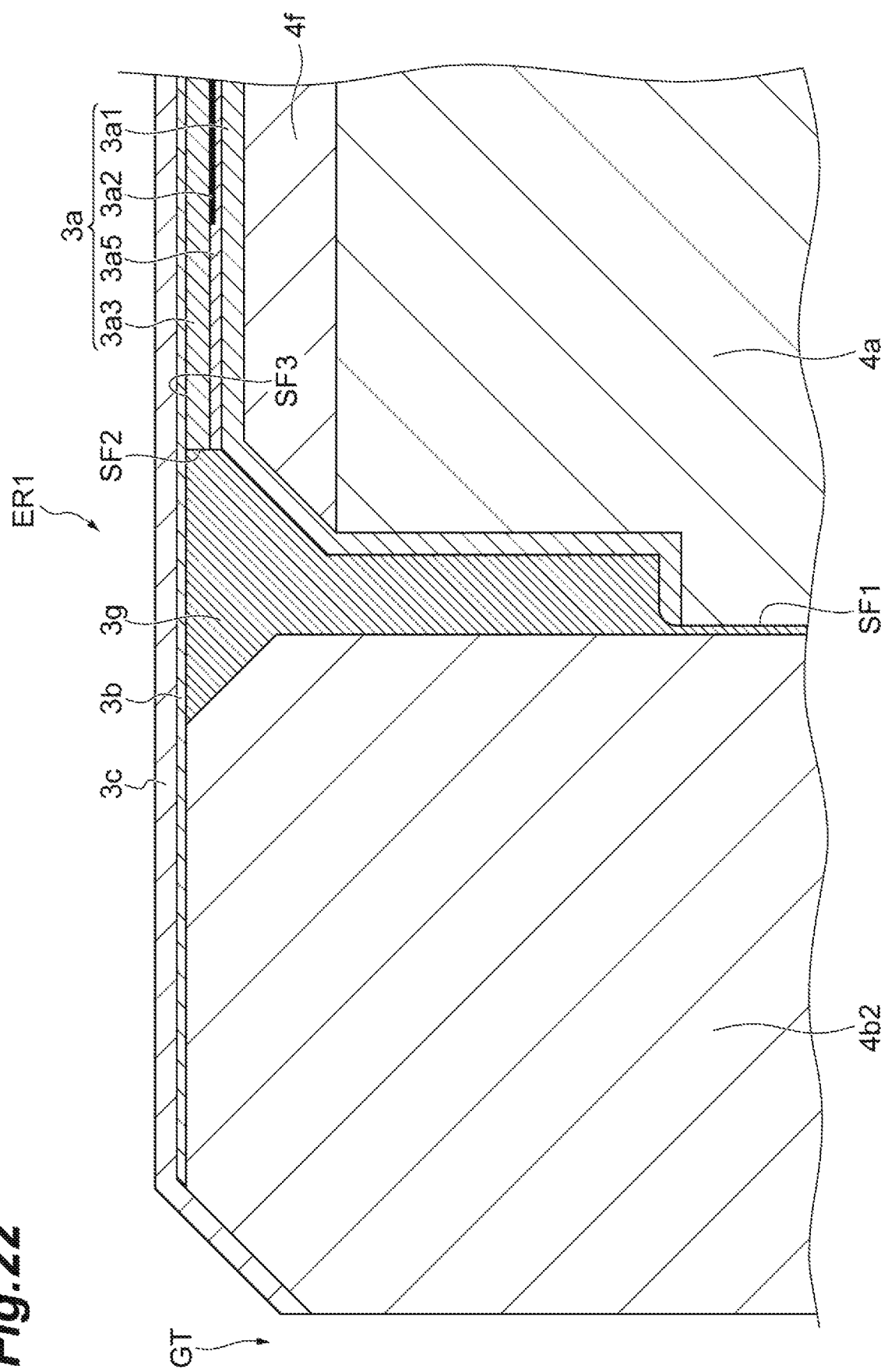
FIG. 22 is a diagram showing another example of the configuration of the end portion of the substrate placing table shown in FIG. 1.

The modification example shown in FIG. 22 will be described. FIG. 22 is a modification example of the configuration of the substrate placing table 2 in the region ER1 facing the hole GT. The configuration of the substrate placing table 2 shown in FIG. 22 has the conductive region 4f, and the configuration of the substrate placing table 2 shown in FIG. 22 is different from the configuration of the substrate placing table 2 shown in FIG. 20 in that the conductive region 4f is provided. The conductive region 4f is provided on the main body part 4a and is in contact with the main body part 4a. The layer 3a1 is provided on the conductive region 4f and is in contact with the main body part 4a and the conductive region 4f.

The configuration shown in each of FIGS. 21 and 22 in which the conductive region 4f is provided is also the same in FIGS. 15 to 18.

Figure 23:
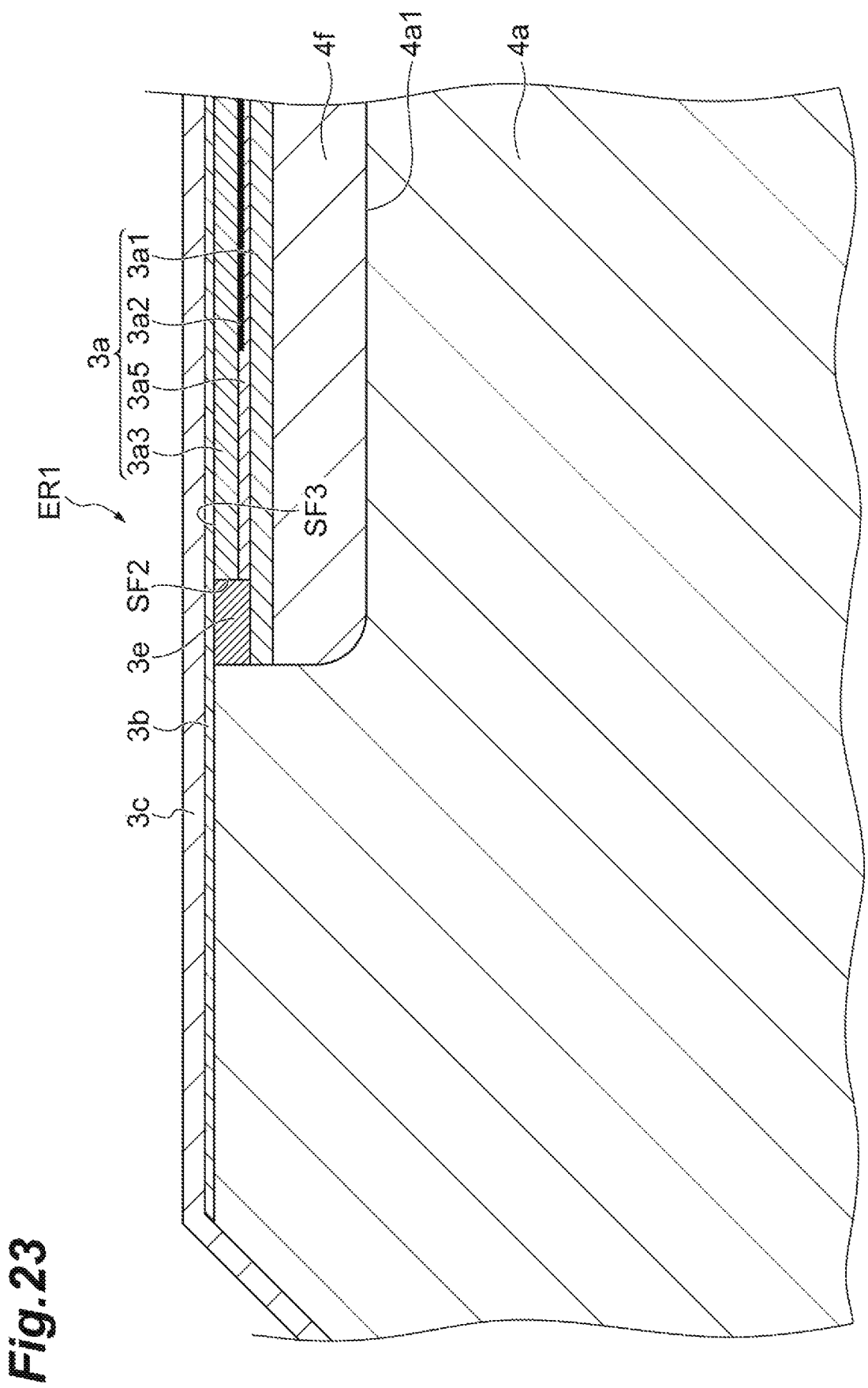
FIG. 23 is a diagram showing another example of the configuration of the end portion of the substrate placing table shown in FIG. 1.

The modification example shown in FIG. 23 will be described. FIG. 23 is a modification example of the configuration of the substrate placing table 2 in the region ER1. In the configuration of the substrate placing table 2 shown in FIG. 23, a recessed portion 4a1 is provided on the surface of the main body part 4a. The conductive region 4f, the lamination layer portion 3a, and the resin region 3e are provided in the recessed portion 4a1. The lamination layer portion 3a shown in FIG. 23 has the layer 3a1, the adhesion layer 3a5 and the electrode layer 3a2 provided on the layer 3a1, and the layer 3a3 provided on the adhesion layer 3a5 and the electrode layer 3a2. The lamination layer portion 3a shown in FIG. 23 does not have the adhesion layer 3a4 shown in FIG. 8 and the like. The layer 3a1 is provided on the conductive region 4f. The electrode layer 3a2, the adhesion layer 3a5, the layer 3a3, and the resin region 3e are provided on the layer 3a1. The resin region 3e is in contact with the layer 3a1 and the side surface SF2 of the lamination layer portion 3a and covers the side surface SF2. The intermediate layer 3b covers the layer 3a3, the resin region 3e, and the main body part 4a and is in contact with the layer 3a3, the resin region 3e, and the main body part 4a.

Figure 24:
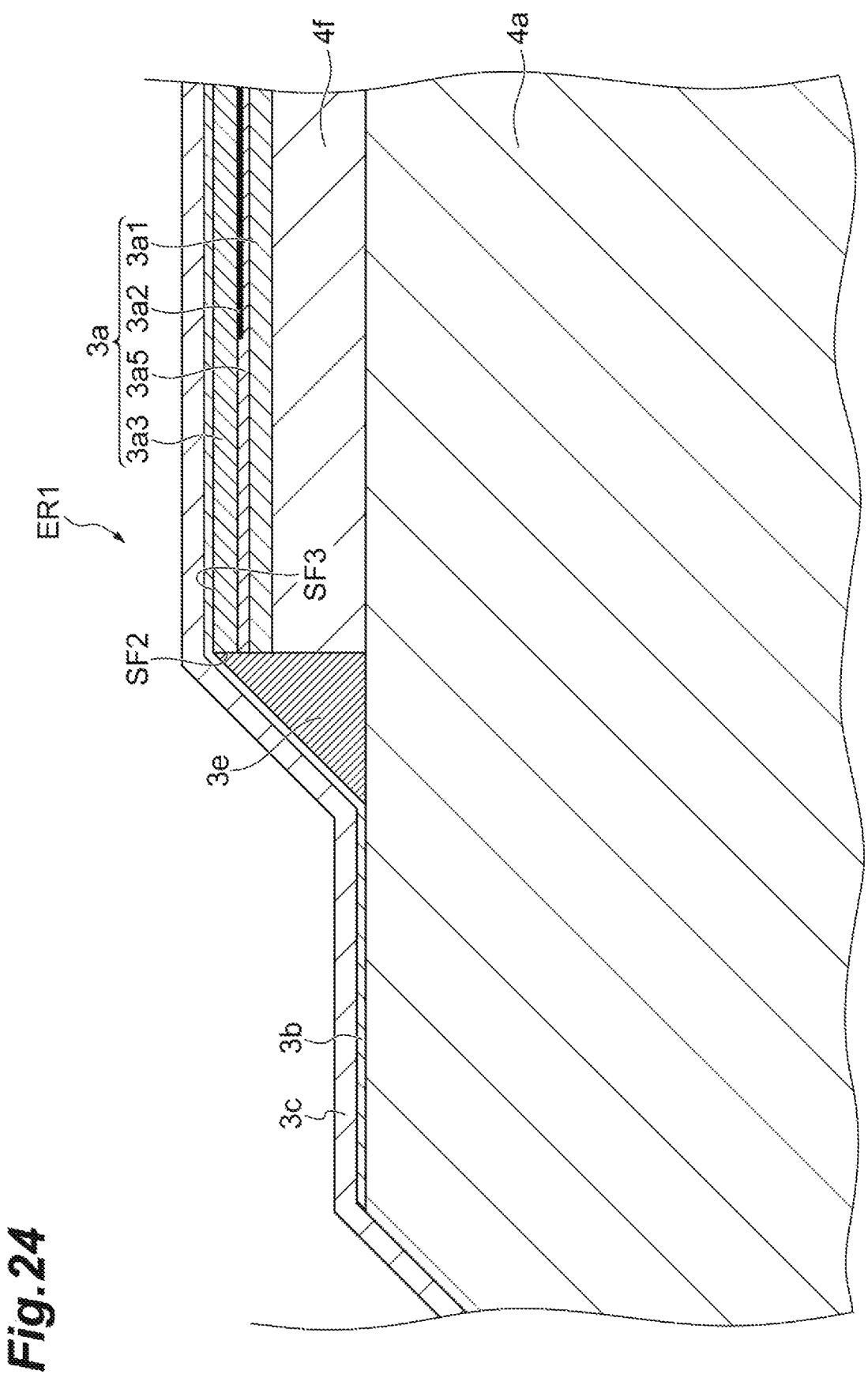
FIG. 24 is a diagram showing another example of the configuration of the end portion of the substrate placing table shown in FIG. 1.

The modification example shown in FIG. 24 will be described. FIG. 24 is a modification example of the configuration of the substrate placing table 2 in the region ER1. In the configuration of the substrate placing table 2 shown in FIG. 24, the conductive region 4f is provided on the main body part 4a, and the lamination layer portion 3a is provided on the conductive region 4f. The lamination layer portion 3a shown in FIG. 24 has the layer 3a1, the adhesion layer 3a5 and the electrode layer 3a2 provided on the layer 3a1, and the layer 3a3 provided on the adhesion layer 3a5 and the electrode layer 3a2. The lamination layer portion 3a shown in FIG. 24 does not have the adhesion layer 3a4 shown in FIG. 8 and the like. The layer 3a1 is provided on the conductive region 4f. The resin region 3e is provided on the main body part 4a, is in contact with the main body part 4a, the side surface SF2 of the lamination layer portion 3a, and the side surface of the conductive region 4f, covers the side surface SF2 and the side surface of the conductive region 4f and has a tapered shape that is tapered in a direction separated from the lamination layer portion 3a. The intermediate layer 3b covers the layer 3a3, the resin region 3e, and the main body part 4a and is in contact with the layer 3a3, the resin region 3e, and the main body part 4a.

In the substrate placing table 2 having the configuration shown in each of FIGS. 8 to 24 described above, the side surface SF2 of the electrostatic chuck 3 is covered with the resin region 3e made of a material having a relatively high viscosity and the resin region 3e is cured, or the side surface SF2 of the electrostatic chuck 3 is covered with the insulating region 3f. Therefore, the occurrence of cracks or the like in the intermediate layer 3b and the covering layer 3c covering the resin region 3e or the insulating region 3f whose shape is maintained is suppressed, and both the intermediate layer 3b and the covering layer 3c can be formed in a good shape together with the configuration of the side surface SF2 of the electrostatic chuck 3 (the resin region 3e or the insulating region 3f).

According to an exemplary embodiment, a technique for suppressing an electric discharge between the substrate placing table and the substrate can be provided.

Although various exemplary embodiments have been described above, various modified aspect may be configured without being limited to the above-described exemplary embodiments.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate support comprising:
   a base; and
   an electrostatic chuck disposed on the base,
   the electrostatic chuck including:
      a stack disposed on the base, the stack having a side face, the stack including a first insulation layer, a second insulation layer, and an electrode layer disposed between the first insulation layer and the second insulation layer, the electrode layer being covered by one or both of the first insulation layer and the second insulation layer;
      a resin region covering the side face of the stack and having an inclined face,
      a first cover layer covering the stack and the resin region; and
      a second cover layer covering the first cover layer, the second cover layer comprising ceramic material.

2. The substrate support according to claim 1, wherein the inclined face covered is by the base.

3. The substrate support according to claim 1, wherein the inclined face is an inclined upper face covered by the first cover layer.

4. The substrate support according to claim 3, wherein the resin region has a lower face, and the inclined upper face is inclined by 45 degrees or less to the lower face.

5. The substrate support according to claim 1, further comprising:
   an additional insulating layer disposed on the base, wherein
   the insulating ring is in contact with the side face of the stack and the additional insulating layer.

6. The substrate support according to claim 5, wherein the first insulating layer comprises a ceramic material, or a resin material selected from the group consisting of polyimide, silicone, epoxy and acrylic resins.

7. The substrate support according to claim 6, wherein the second insulating resin layer comprises a resin material selected from the group consisting of polyimide, silicone, epoxy and acrylic resins.

8. The substrate support according to claim 7, wherein the first cover layer comprises a base material and a particulate material dispersed in the base material, and at least part of the particulate material is in contact with the second insulating layer and the second cover layer.

9. The substrate support according to claim 8, wherein the base sublayer comprises a silicone resin and the particulate material comprises a ceramic material.

10. A plasma processing apparatus comprising:
    a plasma processing chamber;
    a substrate support disposed in the plasma processing chamber, the substrate support comprising:
    a base; and
    an electrostatic chuck disposed on the base,
    the electrostatic chuck including:
       a stack disposed on the base, the stack having a side face, the stack including a first insulation layer, a second insulation layer, and an electrode layer disposed between the first insulation layer and the second insulation layer, the electrode layer being covered by one or both of the first insulation layer and the second insulation layer;
       a resin region covering the side face of the stack and having an inclined face,
       a first cover layer covering the stack and the resin region; and
       a second cover layer covering the first cover layer, the second cover layer comprising a ceramic material; and
    a RF power source electrically connected to the base, the RF power source being configured to generate a RF power having a frequency of 3 MHz or less.

* * * * *